United States Patent
Yamagata et al.

(10) Patent No.: US 12,247,318 B2
(45) Date of Patent: Mar. 11, 2025

(54) METHOD FOR PRODUCING SiC SINGLE CRYSTAL AND METHOD FOR SUPPRESSING DISLOCATIONS IN SiC SINGLE CRYSTAL

(71) Applicant: Shin-Etsu Chemical Co., Ltd., Tokyo (JP)

(72) Inventors: Norio Yamagata, Echizen (JP); Naofumi Shinya, Echizen (JP); Yu Hamaguchi, Echizen (JP); Toshihiro Tsumori, Echizen (JP); Takehisa Minowa, Echizen (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 126 days.

(21) Appl. No.: 17/939,152

(22) Filed: Sep. 7, 2022

(65) Prior Publication Data
US 2023/0083924 A1    Mar. 16, 2023

(30) Foreign Application Priority Data
Sep. 9, 2021 (JP) .................................. 2021-147017

(51) Int. Cl.
*C30B 29/36* (2006.01)
*C30B 23/06* (2006.01)
(Continued)

(52) U.S. Cl.
CPC ............ *C30B 29/36* (2013.01); *C30B 23/066* (2013.01); *C30B 25/10* (2013.01); *C30B 35/002* (2013.01)

(58) Field of Classification Search
CPC .............................. C30B 29/36; C30B 35/002
See application file for complete search history.

(56) References Cited

U.S. PATENT DOCUMENTS

2012/0132132 A1*  5/2012  Urakami ............... C30B 23/025
                                                                117/106
2017/0067183 A1*  3/2017  Seki ........................ C30B 9/12
(Continued)

FOREIGN PATENT DOCUMENTS

JP         2000-264790 A      9/2000
JP         2001181066 A  *    7/2001    ........... C04B 35/565
(Continued)

OTHER PUBLICATIONS

"SiC solution growth method", State-of-the-Art SiC Power Device Technology, published May 14, 2010, S&T Publishing, Inc., Chapter 4, Section 1, 1.2, pp. 41-43, cited in Specification, w/English translation (8 pages).
(Continued)

*Primary Examiner* — Hua Qi
(74) *Attorney, Agent, or Firm* — WHDA, LLP

(57) ABSTRACT

A SiC single crystal is produced by impregnating a molten alloy of silicon and a metallic element M that increases carbon solubility into a SiC sintered body to form a SiC crucible, placing silicon and M in the crucible and heating the crucible to melt the silicon and M and form a Si—C solution, dissolving silicon and carbon in the solution from surfaces of the crucible in contact with the solution, contacting a SiC seed crystal with the top of the solution to grow a first SiC single crystal on the SiC seed crystal by a solution process, and bulk growing a second SiC single crystal on a face of the solution-grown first SiC single crystal by a sublimation or gas process. This method enables a low-dislocation, high-quality SiC single crystal to be produced by a vapor phase process.

14 Claims, 20 Drawing Sheets

(51) Int. Cl.
    *C30B 25/10*     (2006.01)
    *C30B 35/00*     (2006.01)

(56)     References Cited

U.S. PATENT DOCUMENTS

| 2018/0230623 | A1 | 8/2018 | Shinya et al. | |
|---|---|---|---|---|
| 2018/0257993 | A1* | 9/2018 | Shinya | C30B 15/10 |
| 2020/0024199 | A1* | 1/2020 | Kanazawa | C04B 41/88 |

FOREIGN PATENT DOCUMENTS

| JP | 2004-2173 A | 1/2004 |
|---|---|---|
| JP | 2006-143555 A | 6/2006 |
| JP | 2015-110495 A | 6/2015 |
| JP | 2015-110496 A | 6/2015 |
| JP | 2015-110498 A | 6/2015 |
| JP | 2015-110499 A | 6/2015 |
| JP | 2015-110500 A | 6/2015 |
| JP | 2015-110501 A | 6/2015 |
| JP | 2017-31034 A | 2/2017 |
| JP | 2017-31036 A | 2/2017 |

OTHER PUBLICATIONS

Komatsu et al., "Low-TSD bulk growth by application of TSD conversion layer on solution-grown 4° off-axis C-face to sublimation process" Application of TSD conversion layer by solution growth for reduction of TSDs in 4H—SiC bulk crystals, Proceedings of 5th Advanced Power Semiconductor Subcommittee, 2018, vol. 5, pp. 125-126, cited in Specification, w/English translation (5 pages).

Sugiyama et al., "SiC Bulk Single Crystal Growth by Sublimation Method", Applied Physics vol. 70, No. 5, pp. 569 to 570, (2001), with English translation.

Non-Final Office Action dated Mar. 20, 2024, issued in U.S. Appl. No. 17/879,218. (16 pages).

\* cited by examiner

FIELD OF VIEW: 2.1 × 1.6 mm

METHOD FOR PRODUCING SiC SINGLE CRYSTAL AND METHOD FOR SUPPRESSING DISLOCATIONS IN SiC SINGLE CRYSTAL

CROSS-REFERENCE TO RELATED APPLICATION

This non-provisional application claims priority under 35 U.S.C. § 119(a) on Patent Application No. 2021-147017 filed in Japan on Sep. 9, 2021, the entire contents of which are hereby incorporated by reference.

TECHNICAL FIELD

The present invention relates to silicon carbide (SiC) crystal growth technology. More particularly, the invention relates to a SiC single crystal production process that enables low-dislocation, high-quality SiC single crystals to be stably produced, and relates also to a method for suppressing dislocations in SiC single crystals.

BACKGROUND ART

SiC is a wide-bandgap semiconductor material. With its excellent heat conductivity and chemical stability and given also its dielectric breakdown properties and transistor properties such as saturated drift velocity, SiC possesses basic physical characteristics that make it well-suited for use in power devices. For these and other reasons, SiC shows much promise as a next-generation power device material. Indeed, the commercialization of SiC power devices has been reported.

However, SiC substrates are expensive compared with silicon substrates, in addition to which single-crystal substrates that are sufficiently low-dislocation and high-quality have yet to be achieved. The main reason why low-dislocation, high-quality SiC single-crystal substrates are difficult to produce is that SiC does not melt under atmospheric pressure. In the case of silicon, which is widely used in semiconductor device substrates, the melting point under atmospheric pressure is 1,414° C. and a low-dislocation, high-quality large-diameter single crystal can be obtained from a silicon melt by the Czochralski (CZ) method or the float-zone (FZ) method.

By contrast, because SiC sublimates at a temperature of about 2,000° C. when heated under atmospheric pressure, a SiC single crystal cannot be produced using crystal growing processes based on the CZ method or the FZ method. Hence, SiC single crystals today are produced chiefly by sublimation processes such as the modified Lely method. Sublimation processes are currently the only way to mass-produce SiC single crystals. Four inch-diameter SiC single-crystal substrates produced in this way are widely available commercially, and 6 inch-diameter SiC single-crystal substrates too are now mass produced and commercially available as well.

However, when SiC single crystals obtained by a sublimation method are used to fabricate power devices, the device characteristics are not always adequate. This is because achieving low dislocations in a SiC single crystal is not easy. Crystal growth by sublimation is a process that involves deposition from a vapor phase. The growth rate is slow and, moreover, temperature control within the reaction space is difficult. In recent years, as a result of vigorous improvements and refinements in the technology, the density of micropipe dislocations has decreased. However, lattice dislocations which affect the electrical properties of a device, such as threading screw dislocations (TSD), threading edge dislocations (TED) and basal plane dislocations (BPD), are still present in a high density within single crystals.

The noun for wafer sizes in recent semiconductor device substrates is shifting from a 4-inch diameter to a 6-inch diameter. With this increase in diameter, the number of dislocations within the crystal has risen, resulting in a low device yield today compared with four-inch diameter wafers. The problem of dislocations is likely to become even more acute as the technology transitions to even larger diameter substrates (8 inches and up). In such cases, because vapor phase growth by a sublimation process or a gas process propagates seed crystal (substrate) dislocations, the quality of the seed crystal is important. Obviously, as the single-crystal diameter increases, high-quality large-diameter seed crystals become necessary, yet the number of dislocations rises with increasing diameter and so high-quality seed crystals have yet to be achieved. On the other hand, in crystal growth by a solution process, investigations of the solvent composition and the crucible material from which the carbon is supplied have demonstrated that a growth rate of about 200 μm/h can be achieved and that the crystal thus obtained has far fewer dislocations and is of far higher quality than commercial products obtained by a sublimation process.

SiC crystal growth methods based on the solution process have recently attracted attention (see, for example, JP-A 2000-264790, JP-A 2004-002173 and JP-A 2006-143555). As mentioned above, SiC itself does not melt under atmospheric pressure. In SiC single crystal production methods based on the solution process, a SiC single crystal is obtained by having carbon dissolve into a silicon melt within a graphite crucible from a high-temperature region at the bottom of the crucible, bringing a SiC seed crystal into contact with this Si—C melt, or immersing a SiC seed crystal in this Si—C melt, and inducing epitaxial growth on the SiC seed crystal. In this type of solution process, because SiC crystal growth proceeds in a state very close to thermal equilibrium, compared with a SiC single crystal obtained by a sublimation process, a low-dislocation product can be obtained.

Solution processes for obtaining a SiC single crystal encompass a variety of techniques. In State-of-the-Art SiC Power Device Technology, Chapter 4, Section 1, 1.2: "SiC solution growth method," pp. 41-43 (published May 14, 2010, S&T Publishing. Inc.), these techniques are broadly divided into four types: the traveling solvent method (TSM), the slow cooling technique (SCT), the vapor liquid solid (VLS) method and top-seeded solution growth (TSSG). In the present specification, unless noted otherwise, "solution process" refers to top-seeded solution growth (TSSG).

In a SiC single crystal production method based on the solution process, first a silicon melt is formed within a graphite crucible and carbon is made to dissolve in the melt, forming a Si—C solution. Because the carbon in the Si—C solution has a very low solubility of about 1 at %, transition metals and the like are commonly added to the Si—C solution to facilitate dissolution of the carbon (see JP-A 2000-264790, JP-A 2004-002173 and JP-A 2006-143555). It has been reported that elements added for this purpose include transition metal elements such as Ti, Cr, Ni and Fe, low-melting metallic elements such as Al, Sn and Ga, and also various rare-earth elements. The types and amounts of these added elements are determined based on a number of considerations. These include promoting carbon dissolution, having SiC precipitate as the primary phase from the Si—C solution and the remaining solution achieve good equilibrium as a liquid phase, not having the added elements induce the precipitation of carbide and other phases, stable precipitation of the target poly-morph from among the SiC crystal polymorphs, and achieving a solution composition that makes the single crystal growth rate as high as possible.

SiC single crystal growth based on prior-art solution processes is generally carried out by a procedure such as the following. First, a silicon starting material is placed in a crucible made of carbon or graphite and is heated and melted in an inert gas atmosphere. The carbon component is supplied to the silicon melt from the crucible, forming a Si—C solution. In some cases, a carbon compound is placed in the crucible and melted together with the silicon starting material. After sufficient carbon component has thus dissolved in the Si—C solution, a SiC seed crystal is brought into contact with the Si—C solution and, utilizing a temperature gradient that has been formed in the overall solution, a single crystal is grown.

However, there are certain problems with such prior-art solution processes. One problem is that, as growth of the SiC single crystal proceeds, the silicon component gradually disappears from the Si—C solution and the solution composition slowly changes. When the solution composition changes during growth of the SiC single crystal, the SiC precipitation environment of course changes. As a result, stably continuing SiC single crystal growth for an extended period of time becomes difficult. A second problem is the excess melting and incorporation of carbon from the crucible. As SiC single crystal growth proceeds, the silicon component gradually disappears from the Si—C solution; at the same time, carbon is continuously supplied from the crucible. A relative excess of carbon thus enters into the Si—C solution, which changes the Si/C compositional ratio of the Si—C solution. A third problem is the precipitation of SiC polycrystals on crucible surfaces (especially the inside wall) in contact with the Si—C solution. When excess carbon dissolves into the Si—C solution from the crucible as mentioned above, fine SiC polycrystals readily form on the inside walls of the crucible. Such SiC polycrystals float within the SiC solution and reach the vicinity of the solid-liquid interface between the SiC single crystal and the Si—C solution during crystal growth, interfering with single crystal growth.

CITATION LIST

Patent Document 1: JP-A 2000-264790
Patent Document 2: JP-A 2004-002173
Patent Document 3: JP-A 2006-143555
Patent Document 4: JP-A 2015-110495
Patent Document 5: JP-A 2015-110496
Patent Document 6: JP-A 2015-110498
Patent Document 7: JP-A 2015-110499
Patent Document 8: JP-A 2015-110500
Patent Document 9: JP-A 2015-110501
Patent Document 10: JP-A 2017-031034
Patent Document 11: JP-A 2017-031036
Non-Patent Document 1: State-of-the-Art SiC Power Device Technology, Chapter 4, Section 1, 1.2: "SiC solution growth method," pp. 41-43 (published May 14, 2010, S&T Publishing, Inc.)
Non-Patent Document 2: Proceedings of $5^{th}$ Advanced Power Semiconductor Subcommittee (2018), Vol. 05: "Low-TSD bulk growth by application of TSD conversion layer on solution-grown 4° off-axis C-face to sublimation process," (Application of TSD conversion layer by solution growth for reduction of TSDs in 4H-SiC bulk crystals) pp. 125-126

SUMMARY OF THE INVENTION

It is therefore an object of this invention to provide a method for producing low-dislocation, high-quality SiC single crystals even by a vapor phase process such as a sublimation process or a gas process. Another object of the invention is to provide a method for suppressing dislocations in a SiC single crystal.

SiC single crystals having fewer dislocations than those obtained by a sublimation process can be obtained via a solution process. However, in crystal growth by a conventional solution process using a graphite crucible, because voids readily form due to the influence of gas constituents present in the solvent and the crucible, following removal of the bulk crystal from the crystal growing apparatus, the use of crystal from the vicinity of the seed crystal is avoided. Generally, in the case of crystal growth by the sublimation process, etc. as well, growth is unstable at the early stage of growth. Hence, following bulk growth, the portion of the crystal near the seed crystal is of poor quality and so is excluded from device applications. Also, according to Proceedings of $5^{th}$ Advanced Power Semiconductor Subcommittee (2018), Vol. 05: "Low-TSD bulk growth by application of TSD conversion layer on solution-grown 4° off-axis C-face to sublimation process," (Application of TSD conversion layer by solution growth for reduction of TSDs in 4H-SiC bulk crystals) pp. 125-126, by using a solution process to grow a SiC single crystal on a 4H-SiC 4° off-axis C-face, a growth face having a low threading screw dislocation (TSD) density can be obtained. However, when CMP polishing or the like is carried out to remove deposits and surface irregularities on the growth face, dislocation reconversion occurs in subsequent bulk growth by a vapor phase process, resulting in an increase in dislocations. In addition, because the seed crystal for the sublimation process, as described in the above report, is solution grown on a 4° off-axis C-face, as the thickness of growth increases, solvent entrapment tends to arise. That is, the crystal quality at the initial stage of growth is important; following solution growth, to achieve a higher quality via bulk growth by a vapor phase process, it has been necessary to stabilize the carbon concentration within the solvent after removing, from the initial stage of growth, gas constituents that cause voids and defects.

Accordingly, in a first aspect, the invention provides a method for producing a SiC single crystal, which method includes the steps of, in order:

forming a SiC crucible by rendering an alloy of silicon and a metallic element M that increases carbon solubility into a melt and impregnating the melt into a SiC sintered body having a relative density of from 50 to 90%, placing silicon and the metallic element M in the SiC crucible and heating the crucible to melt the silicon and metallic element M within the crucible and form a Si—C solution, dissolving in the Si—C solution, from surfaces of the SiC crucible in contact with the Si—C solution, silicon and carbon making up the SiC crucible, contacting a SiC seed crystal with a top portion of the Si—C solution so as to grow a first SiC single crystal on the SiC seed crystal by a solution process, and bulk growing a second SiC single crystal on a face of the solution-grown first SiC single crystal by a sublimation process or a gas process.

In a preferred embodiment of the production method according to the first aspect of the invention, the metallic element M placed in the SiC crucible is an uncombined metallic element or is an alloy which includes a plurality of metallic elements and does not include silicon.

In another preferred embodiment of the production method, the metallic element M includes:

at least one first metallic element M1 selected from the group consisting of La, Ce, Pr, Nd, Sm, Eu, Gd, Tb, Dy, Ho, Y and Lu; and at least one second metallic element M2 selected from the group consisting of Ti, V, Cr, Mn, Fe, Co, Ni and Cu and/or at least one third metallic element M3 selected from the group consisting of Ga, Ge, Sn, Pb and Zn.

In the foregoing embodiment, the metallic element M may include the first metallic element M1 and the second metallic element M2. The total content of the metallic element M in the Si—C solution may be from 1 to 80 at % of the combined amount of silicon and the metallic element M. The content of the first metallic element M1 in the Si—C solution may be at least 1 at % of the combined amount of silicon and the metallic element M, and the contents of the second metallic element M2 and the third metallic element M3 in the Si—C solution may each be at least 1 at % of the combined amount of silicon and the metallic element M.

In yet another preferred embodiment, the SiC sintered body has an oxygen content of 100 ppm or less.

In still another preferred embodiment, growth of the first SiC single crystal by a solution process is carried out at a Si—C solution temperature of between 1,300 and 2,300° C.

In a further preferred embodiment, production is carried out with the SiC crucible held within a second crucible made of a heat-resistant carbon material.

In a yet further preferred embodiment, the first SiC single crystal grown by a solution process has a thickness of from 10 to 1,000 μm.

In a still further preferred embodiment, the SiC crucible and the Si—C solution are used repeatedly.

In a second aspect, the invention provides a method for suppressing dislocations in a SiC single crystal, which method includes the steps of, in order:

forming a SiC crucible by rendering an alloy of silicon and a metallic element M that increases carbon solubility into a melt and impregnating the melt into a SiC sintered body having a relative density of from 50 to 90%, placing silicon and the metallic element M in the SiC crucible and heating the SiC crucible to melt the silicon and metallic element M and form a Si—C solution, dissolving in the Si—C solution, from surfaces of the SiC crucible in contact with the Si—C solution, silicon and carbon making up the SiC crucible, and contacting a SiC seed crystal with a top portion of the Si—C solution to grow a first SiC single crystal on the SiC seed crystal by a solution process.

In a preferred embodiment of the dislocation suppressing method according to the second aspect of the invention, the method further includes the step of bulk growing a second SiC single crystal on a face of the solution-grown first SiC single crystal by a sublimation process or a gas process.

In another preferred embodiment, the dislocation suppressing method further includes the steps of:

furnishing a SiC single-crystal wafer obtained from the second SiC single crystal bulk-grown by a sublimation process or a gas process for use as a seed crystal, and growing a third SiC single crystal by a solution process on the SiC seed crystal.

In yet another preferred embodiment, the dislocation suppressing method further includes the step of bulk growing a fourth SiC single crystal on a face of the solution-grown third SiC single crystal by a sublimation process or a gas process.

Advantageous Effects of the Invention

The present invention makes it possible, even with a SiC wafer sliced from a SiC ingot produced by a vapor phase process such as sublimation, to reduce the number of dislocations by carrying out SiC single crystal growth on the SiC wafer via a specific solution process, and moreover enables a low-dislocation, high-quality SiC single crystal to be obtained by using a vapor phase process such as a sublimation process or a gas process to carry out bulk growth on a growth face of this SiC single crystal. Specifically, by using a solution process to carry out from about 10 μm to about 1,000 μm of crystal growth on a SiC wafer produced by a sublimation process, dislocations can be greatly reduced. Even if the SiC wafer has more dislocations owing to a larger diameter, because the number of dislocations can be reduced in this way, use of the resulting wafer as a seed crystal (substrate) enables the quality of the bulk crystal obtained by a sublimation process or a gas process to be increased.

BRIEF DESCRIPTION OF THE DIAGRAMS

DESCRIPTION OF THE EMBODIMENTS

The objects, features and advantages of the invention will become more apparent from the following detailed description taken in conjunction with the appended diagrams.

The inventive method for producing a SiC single crystal uses a solution process in which a seed crystal is brought into contact with a Si—C solution (Si—C melt) held in a crucible, which process is referred to as top-seeded solution growth (TSSG). That is, the SiC single crystal production method of the invention is characterized by including the steps of forming a SiC crucible by rendering an alloy of silicon and a metallic element M that increases the carbon solubility into a melt and impregnating the melt into a SiC sintered body having a relative density of from 50 to 90%; placing silicon and the metallic element M in the SiC crucible and heating the crucible to melt the silicon and metallic element M within the crucible and form a Si—C solution; dissolving in the Si—C solution, from surfaces of the SiC crucible in contact with the Si—C solution, silicon and carbon making up the SiC crucible; contacting a SiC seed crystal with a top portion of the Si—C solution to grow a first SiC single crystal on the SiC seed crystal by a solution process: and bulk growing a second SiC single crystal on a face of the solution-grown first SiC single crystal by a sublimation process or a gas process.

Figure 1:
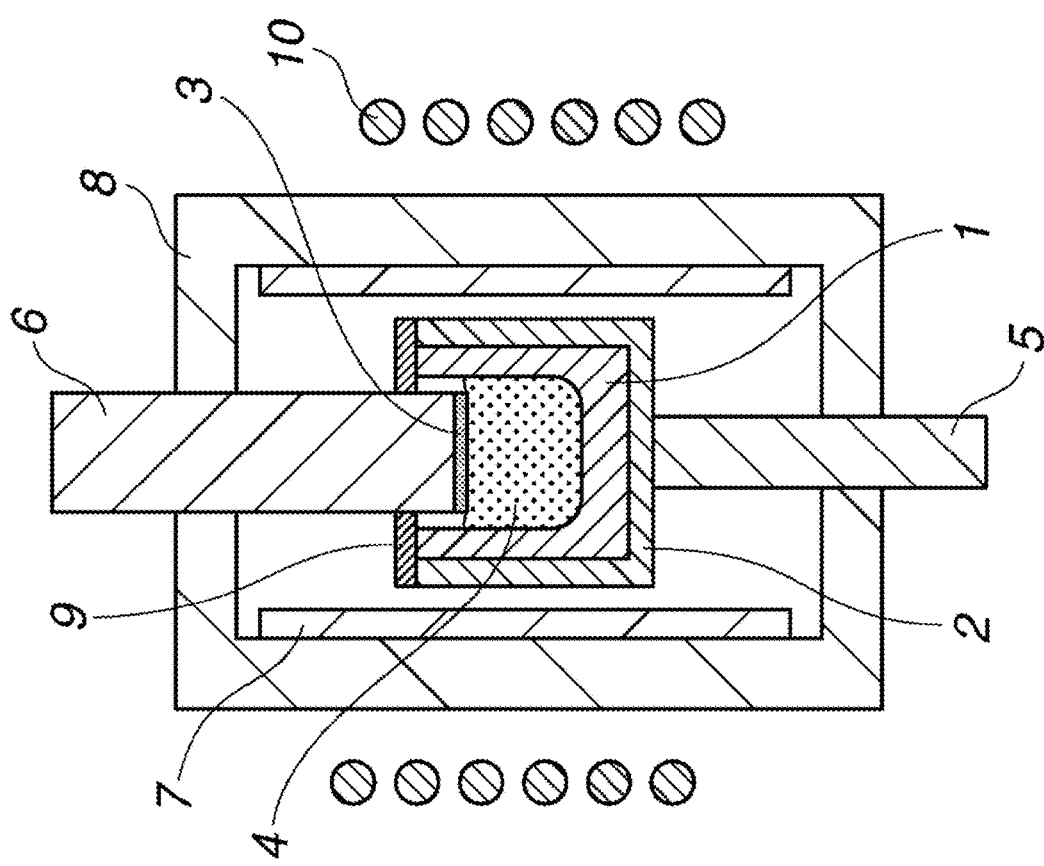
FIG. 1 is a cross-sectional view showing an example of the main portion of a SiC single crystal production apparatus that can be suitably used when crystal growing a SiC single crystal.

FIG. 1 is a cross-sectional view showing an example of a SiC single crystal production apparatus (heating furnace) that can be suitably used when crystal growing a SiC single crystal by the solution process. Shown in this diagram are a SiC crucible 1 for holding a Si—C solution, a second crucible 2 made of a heat-resistant carbon material for holding the SiC crucible 1, a SiC single crystal 3 (seed crystal), a Si—C solution 4 held in the SiC crucible 1, a rotary shaft 5 for rotating the SiC crucible 1 and the second crucible 2 during crystal growth of the SiC single crystal, a rotary shaft 6 for holding the SiC single crystal 3 and for rotating the SiC single crystal 3 during crystal growth, a susceptor 7 formed of a graphite material or the like, a heat shield 8 formed of a graphite material or the like, a top cover 9 to keep the Si—C solution from evaporating, and a radio-frequency (RF) coil 10 for heating the interior of the furnace and setting the Si—C solution to a given temperature and temperature distribution. Although not shown in the diagram, the heating furnace is also equipped with an exhaust outlet and exhaust valve for evacuating the atmosphere within the furnace, and a gas inlet port and gas inlet valve for introducing gas into the furnace.

The crucible prior to heating is typically filled with silicon, although a carbon source may be added together with the silicon. When the interior of the crucible is heated, immediately after heating, the silicon and carbon making up the crucible dissolve out into the silicon melt or the Si—C solution from surfaces of the SiC crucible in contact with the silicon melt or, after the carbon has dissolved, in contact with the Si—C solution. Together with silicon or with silicon and carbon, it is also possible to charge the crucible prior to heating with SiC.

In the practice of the invention, the SiC crucible 1 is composed of a SiC sintered body. This SiC sintered body has a relative density of at least 50%, and preferably at least 70%, but not more than 90%, preferably not more than 88%, and more preferably not more than 85%. As used herein, "relative density" refers to the ratio (%) of the measured density or calculated density of the SiC sintered body relative to the true density for SiC of 3.22 g/cm$^3$; that is, the value obtained by dividing the measured density or calculated density of the SiC sintered body by the true density of SiC, expressed as a percentage. The measured density is the value obtained by, for example, measuring the SiC sintered body using Archimedes' method. The calculated density is the value obtained by dividing the weight of the SiC sintered body by the volume of the SiC sintered body, as calculated from the measured dimensions of the SiC sintered body (i.e., in the case of a cylindrical crucible, the outside diameter, height, inside diameter (diameter of cavity), and height of cavity).

A SiC crucible formed of a SiC sintered body having a relative density within the above range can be obtained by, for example, dry pressing or slip casting, although the production method is not limited to these.

A metallic element M which increases carbon solubility in a Si—C solution is added to the Si—C solution 4 held in the SiC crucible 1. Adding a metallic element M that increases carbon solubility to the Si—C solution is advantageous because, when a SiC crucible is used, metal carbide that forms due to bonding between the added metallic element M and carbon is kept from forming. When a carbon crucible (graphite crucible) is used, the ratio of silicon within the Si—C solution decreases or excessive carbon enters into the solution, lowering the Si/C compositional ratio, as a result of which the metallic element M that is added to facilitate dissolution of the carbon bonds more readily with the carbon and a metal carbide tends to form. Such a metal carbide has a high melting point and floats within the Si—C solution; if the floating metal carbide reaches the vicinity of the seed crystal surface and deposits thereon, formation of a SiC single crystal becomes impossible. By contrast, when a SiC crucible is used, excessive carbon C does not enter into the Si—C solution. As a result, the formation of metal carbide is suppressed and growth of the SiC single crystal is unlikely to be hindered.

In cases where silicon and the metallic element M which increases carbon solubility are placed in a SiC crucible 1 formed of a SiC sintered body having a relative density of from 50 to 90%, the pores therein being in an empty state and not filled with a Si—C solution or other melt (a solid at room temperature), such as the state of the SiC crucible prior to use, and the silicon and the metallic element M are melted to form a Si—C solution, if the metallic element M placed within the crucible is in an uncombined state or is an alloy that does not include silicon, a low-melting metal or alloy preferentially penetrates into the SiC sintered body and the metallic element M and the SiC crucible react, as a result of which the composition of the Si—C solution within the SiC crucible ends up deviating from the desired composition. Therefore, in this invention, before placing silicon and the metallic element M which increases carbon solubility in a SiC crucible, an alloy of silicon and the metallic element M, preferably an alloy having substantially the same compositional ratio as the Si—C solution when growing the SiC single crystal, is rendered into a melt and pre-impregnated into a SiC sintered body, i.e., into pores in the SiC sintered body, to give the SiC crucible 1. Specifically, the method may be one that involves placing an alloy in a SiC crucible and heat treating within a temperature range of, for example, at least 1,300° C., and preferably at least 1,500° C., but not more than 2,300° C., and preferably not more than 2,000° C. The heat treatment time is generally from 1 to 10 hours. Impregnation may be carried out in an inert gas atmosphere such as argon or nitrogen, in a vacuum (reduced pressure) atmosphere or a combination thereof (e.g., an inert gas atmosphere followed by a pressure-reduced atmosphere).

Examples of the metallic element M include at least one first metallic element M1 selected from the group consisting of La, Ce, Pr, Nd, Sm, Eu, Gd, Tb, Dy, Ho, Y and Lu, at least one second metallic element M2 selected from the group consisting of Ti, V, Cr, Mn, Fe, Co, Ni and Cu, and at least one third metallic element M3 selected from the group consisting of Ga, Ge, Sn, Pb and Zn. The total content of the metallic element M in the Si—C solution is preferably at least 1 at %, and especially at least 20 at %, but preferably not more than 80 at %, and especially not more than 50 at %, of the combined amount of silicon and M. In this invention, it is preferable for the metallic element M placed in the unheated crucible together with silicon and the optionally added carbon and/or SiC to be an uncombined metallic element M or an alloy which includes a plurality of metallic elements M and does not include silicon, especially an alloy which includes a plurality of metallic elements M.

The metallic element M may consist of any one of the first to third metallic elements M1, M2 and M3 alone or may consist of a suitable combination of these, although it preferably consists of the first metallic element M1 in combination with the second metallic element M2 and/or the third metallic element M3. A combination of metallic element M1 and metallic element M2 is especially preferred. In this case, the content of the first metallic element M1 in the Si—C solution is preferably at least 1 at %, and more preferably at least 5 at %, but preferably not more than 50 at %, and more preferably not more than 40 at %, of the combined amount of silicon and M. Also, the respective contents of the second metallic element M2 and the third metallic element M3 in the Si—C solution are each preferably at least 1 at %, and more preferably at least 2 at %, but not more than 30 at %, and more preferably not more than 20 at %, of the combined amount of silicon and M.

In the practice of the invention, using an apparatus such as that described above, a temperature distribution suitable for crystal growth is formed in the Si—C solution 4 by induction heating of the SiC crucible 1 with the RF coil 10, along with which silicon and carbon in the SiC making up the SiC crucible 1 in contact with the Si—C solution 4 are made to dissolve out from the SiC crucible 1 and into the Si—C solution 4. Next, a SiC seed crystal 3 is brought into contact with the Si—C solution 4 at the top of the SiC crucible 1, thereby growing a SiC single crystal on the SiC seed crystal 3. Accordingly, the temperature on the inside surface of the SiC crucible in contact with the Si—C solution is made sufficiently high to cause the silicon and carbon in the SiC making up the crucible to dissolve out into the Si—C solution 4. Also, the temperature in the vicinity of the solid-liquid interface between the SiC seed crystal 3 and the Si—C solution 4 is made sufficiently high for SiC to grow as a single crystal on the SiC seed crystal 3.

In the SiC single crystal growth step, by suitably controlling the induction heating conditions from the RF coil, suitably setting the relative positions (especially in the vertical direction) of the crucible and the RF coil and suitably rotating the crucible and the SiC single crystal (seed crystal), the desired temperature distribution can be formed in the Si—C solution, in this way enabling the SiC single crystal growth rate and the rate of dissolution by SiC crucible ingredients into the Si—C solution to be suitably controlled.

The temperature of the Si—C solution at the time of crystal growth is controlled within a range of preferably at least 1,300° C., and more preferably at least 1,500° C., but preferably not more than 2,300° C. and more preferably not more than 2,000° C. A seed crystal is brought into contact with the top of the Si—C solution within the SiC crucible, thereby growing a SiC single crystal on the seed crystal. Accordingly, in at least a portion of the area of contact between the SiC crucible and the Si—C solution, a high-temperature region where ingredients from the SiC crucible can be made to dissolve into the Si—C solution is created in the Si—C solution. At the same time, in an area of contact between the Si—C solution and the seed crystal or the growth face of the SiC single crystal that was grown on the seed crystal, a low-temperature region where SiC can grow as a single crystal on the seed crystal or on the SiC single crystal that was grown on the seed crystal is created in the Si—C solution. The Si—C solution has a temperature distribution therein which is preferably such that the temperature gradually rises from the vicinity of the seed crystal toward the vicinity of the inner surface of the SiC crucible (that is, the surface of contact with the Si—C solution), especially throughout the Si—C solution, and is preferably such that the temperature gradually rises from the top of the Si—C solution toward the bottom, especially throughout the Si—C solution. In this case, it is effective to set the temperature difference between the high-temperature region and the low-temperature region to, for example, at least 5° C., especially at least 10° C., and not more than 200° C., especially not more than 100° C. The gradient of the temperature distribution in the Si—C solution is preferably at least 1° C./cm, especially at least 5° C./cm, and preferably not more than 50° C./cm, especially not more than 30° C./cm. Growth of the SiC single crystal is generally carried out in a helium gas, argon gas or other inert gas atmosphere.

FIG. 1 shows the manner in which heating of the crucible is carried out with radio-frequency (RF) waves. However, the heating method is not limited to one that relies on RF waves. Depending on such factors as the control temperature of the Si—C solution, heating may be carried out by other methods such as resistance heating.

Figure 2:
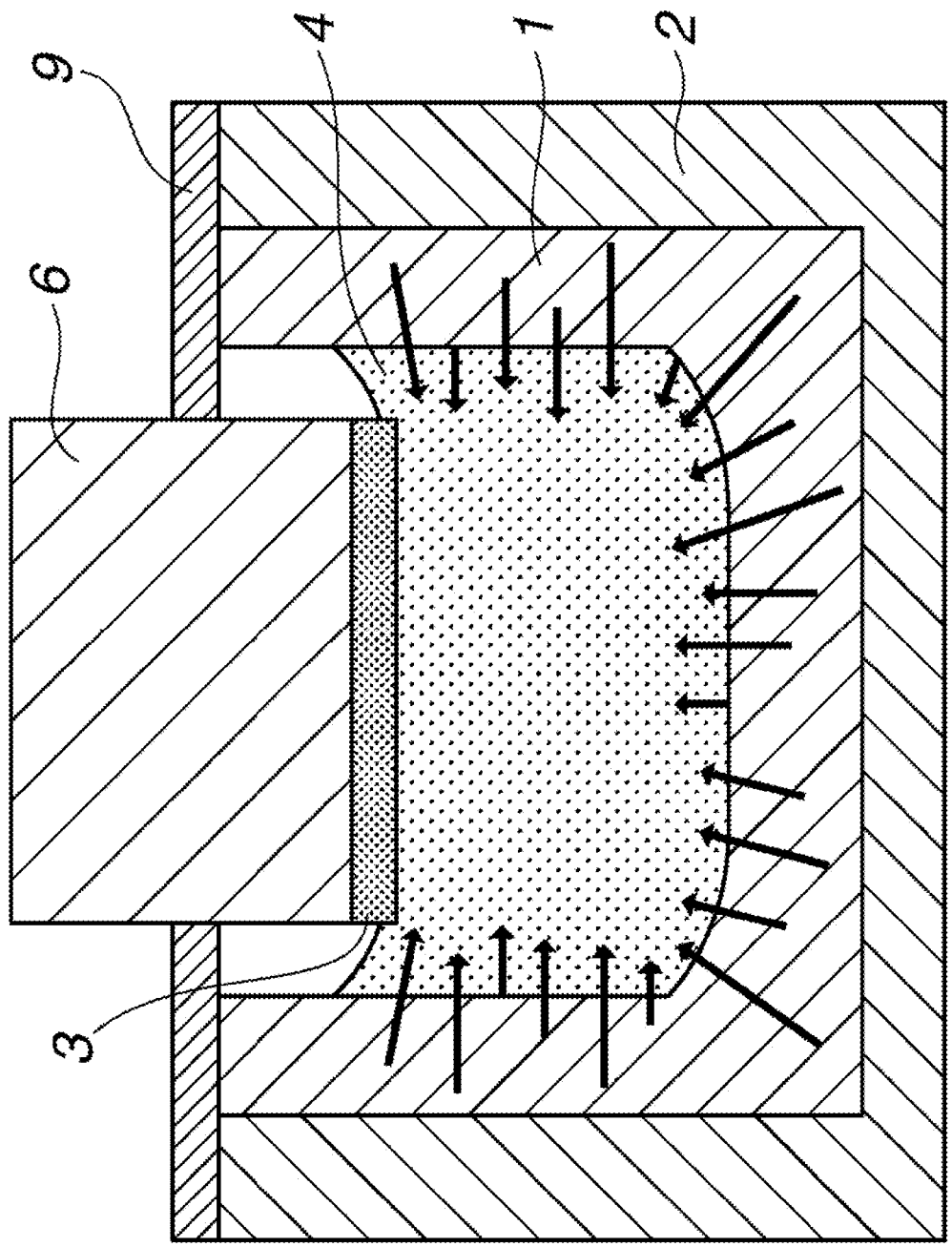
FIG. 2 is a schematic diagram showing the manner in which, when a SiC single crystal is crystal grown using a SiC crucible formed of a SiC sintered body having a relative density of from 50 to 90%, silicon and carbon from inside the SiC crucible dissolve out in a Si—C solution.

FIG. 2 is a diagram which schematically illustrates the manner in which silicon and carbon dissolve out into the Si—C solution from the SiC crucible when a SiC crystal is grown using a SiC crucible formed of a SiC sintered body having a relative density of from 50 to 90%. By creating in the Si—C solution 4 a temperature distribution that is suitable for crystal growth, silicon and carbon from the SiC making up the SiC crucible 1 dissolve out into the Si—C solution 4 from SiC crucible 1 surfaces (especially high-temperature regions) in contact with the Si—C solution 4. The silicon and carbon that have dissolved out become fresh silicon component and carbon component in the Si—C solution 4 and serve as ingredient sources for the single crystal that grows on the SiC seed crystal 3. Also shown in this diagram are a second crucible 2, a rotary shaft 6 and a top cover 9, all of which correspond to like features in FIG. 1.

In such an environment where the dissolution of silicon and carbon from the SiC crucible 1 and into the Si—C solution 4 occurs, the problem of SiC polycrystal precipitation onto crucible surfaces in contact with the Si—C solution does not arise. This is because the conditions under which the SiC making up the SiC crucible 1 dissolves out into the Si—C solution as silicon and carbon do not allow for silicon and carbon to precipitate out as SiC. In other words, by using a crucible made of SiC as the receptacle for the Si—C solution, the precipitation of SiC polycrystals at crucible surfaces in contact with the Si—C solution is suppressed.

Furthermore, by using a SiC crucible formed of a SiC sintered body having a relative density of from 50 to 90%, the Si—C solution not only comes into contact with the surface of the SiC crucible, it also penetrates into the interior (pores) of the sintered body. As indicated by the arrows in FIG. 2, SiC efficiently dissolves out and is supplied from also the interior of the SiC crucible, increasing the crystal growth rate and also suppressing SiC polycrystals. As a result, a state within the solution like that shown in FIG. 2 appears to be achieved. At a relative density for the SiC sintered body making up the SiC crucible of less than 50%, when the SiC crucible dissolves, the SiC disintegrates into SiC particles, giving rise to a conspicuous state in which SiC particles float within the Si—C solution; at a relative density greater than 90%, penetration of the SiC solution into the interior (pores) of the sintered body substantially does not arise and so efficient dissolution of SiC in the SiC solution cannot be achieved.

Figure 3:
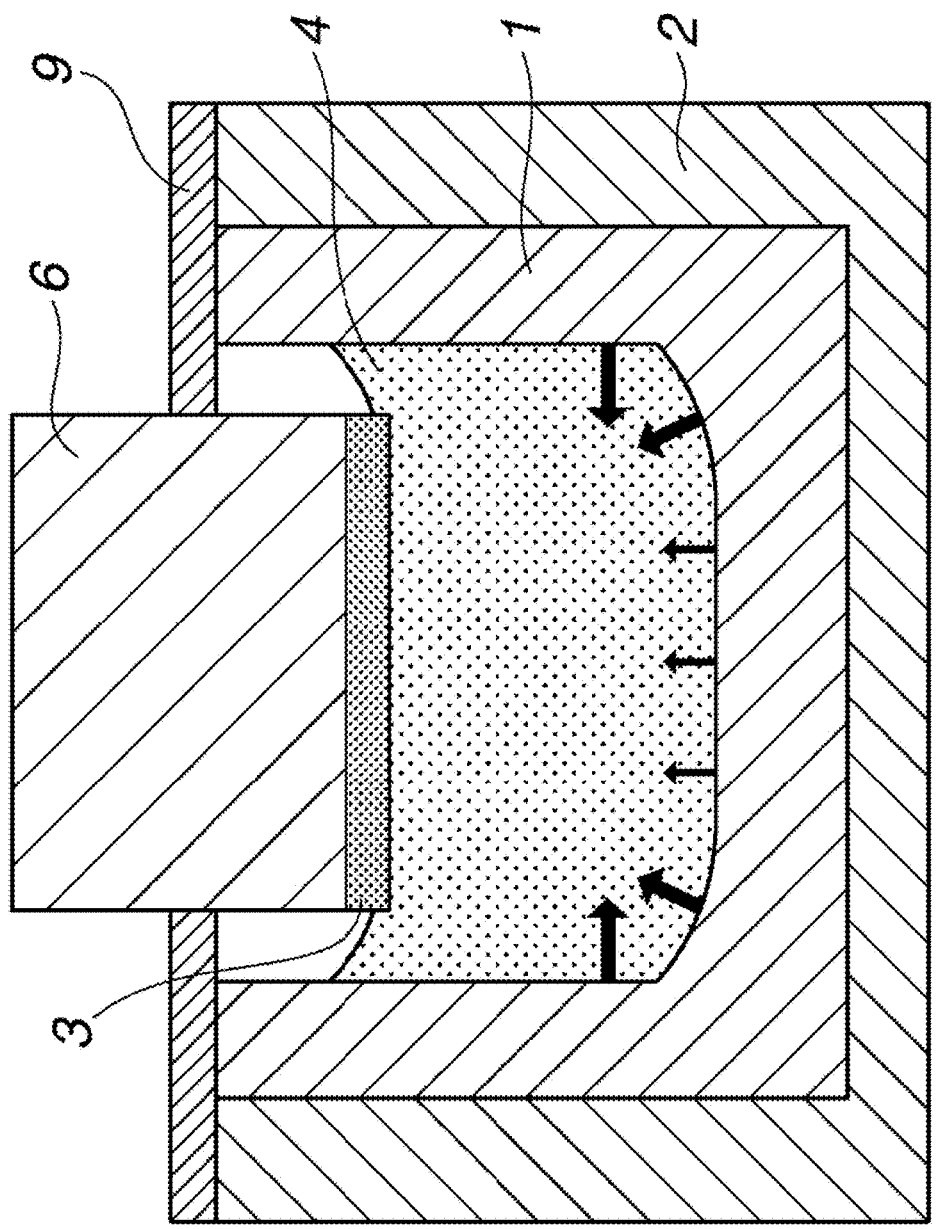
FIG. 3 is a schematic diagram showing the manner in which, when a SiC single crystal is crystal grown using a conventional dense SiC crucible, silicon and carbon from inside the SiC crucible dissolve out in a Si—C solution.

By contrast, FIG. 3 is a diagram that schematically illustrates the manner in which silicon and carbon dissolve out into the Si—C solution from the SiC crucible when a SiC crystal is grown using a conventional dense SiC crucible (e.g., a SiC crucible formed of a SiC sintered body having a relative density of more than 90%). In this case, because the Si—C solution 4 only comes into contact with the surface of the SiC crucible 1 and the dissolution out of silicon and carbon into the Si—C solution 4 is inadequate, the supply of SiC from the SiC crucible (dissolution into the Si—C solution) is not uniform at areas of contact between the SiC crucible and the Si—C solution; instead, SiC dissolution proceeds preferentially at the high-temperature areas of the SiC crucible, especially the bottom corners as indicated by the arrows in FIG. 3, making the growth of a SiC single crystal over an extended period of time difficult. Also shown in this diagram are a second crucible 2, a SiC seed crystal 3, a rotary shaft 6 and a top cover 9, all of which correspond to like features in FIG. 1.

Additionally, in the SiC crucible 1 of the invention, because the SiC sintered body (more precisely, pores in the SiC sintered body) has been impregnated beforehand with a molten alloy of the silicon and the metallic element M, preferably a molten alloy having substantially the same compositional ratio as the Si—C solution used when growing the SiC single crystal, when the silicon and the metallic element M are melted to form a Si—C solution, the metallic element M does not react preferentially with the SiC crucible and so the Si—C solution within the SiC crucible is maintained at the desired composition.

Silicon and carbon continuously dissolve out from the SiC crucible. Generally, by carrying out single crystal growth while rotating the crucible and the seed crystal, it is possible to make the composition within the Si—C solution homogeneous on account of the stirring effect.

In FIG. 1, the SiC crucible 1 is placed inside a second crucible 2 made of a heat-resistant carbon material. In the present invention which uses a SiC crucible formed of a SiC sintered body having a relative density of from 50 to 90%, the Si—C solution sometimes passes through pores in the SiC sintered body and leaks out onto the outside surface of the SiC crucible. For this reason, it is preferable to place the SiC crucible within a second crucible. In this case, the second crucible 2 is preferably formed of a material having a degree of density such that the Si—C solution does not leak out. Using a second crucible also has the advantage of facilitating control of the temperature distribution within the Si—C solution.

Oxygen is generally present as an impurity in the SiC sintered body making up the SiC crucible. The oxygen contained within the SiC sintered body forms an oxide (SiO). Because the boiling point of SiO is about 1,880° C., when the temperature of the Si—C solution is at or above this boiling point, in cases where the SiO gasifies within the Si—C solution with dissolution of the SiC and this gaseous SiO reaches the interface of the growing SiC single crystal with the Si—C solution (solid-liquid interface), there is a risk that it will be incorporated at the crystal growth surface and generate voids within the SiC single crystal. In cases where oxygen present within the SiC sintered body dissolves out into the Si—C solution with the dissolution of SiC and the temperature of the Si—C solution is below the boiling point of SiO, when the oxygen reacts with silicon in the Si—C solution to form SiO and this SiO reaches the interface of the growing SiC single crystal with the Si—C solution (solid-liquid interface), there is a risk that it will be incorporated at the crystal growth surface and generate voids within the SiC single crystal. It is thus preferable for the SiC sintered body to have an oxygen content of not more than 100 ppm.

In the solution process, a SiC single crystal is furnished as the seed crystal. The seed crystal used for this purpose may be, for example, a SiC single crystal obtained by a sublimation process or a SiC single crystal obtained by a solution process ("solution process" here being broadly understood to include the above-mentioned traveling solvent method, slow cooling technique, vapor liquid solid method and top-seeded solution growth method).

In the SiC single crystal production method of the invention, owing to the use of a SiC crucible obtained by impregnating a SiC sintered body having a relative density of from 50 to 90% with an alloy of silicon and a metallic element M that increases carbon solubility, with heating of the crucible, the SiC which makes up the SiC sintered body and serves as a source of silicon and carbon dissolve out into the Si—C solution from the interior of the sintered body as well, so that silicon and carbon are efficiently supplied to the Si—C solution. As a result, silicon and carbon are supplied uniformly and in the proper amount from all areas of contact between the SiC crucible and the Si—C solution, enabling a high-quality SiC single crystal to be stably produced over an extended period of time at a rapid growth rate.

The SiC single crystal grown by the above solution method has a thickness of preferably at least 10 μm, and more preferably at least 50 μm. The thickness of the SiC single crystal grown by the solution method has no particular upper limit. In cases where it is necessary to use a single crystal having a higher crystallinity as the seed crystal (substrate) in the subsequently described vapor phase growth process, the thickness may be set to more than 1,000 μm. However, it is generally preferable for the thickness to be 1,000 μm or less and, from the standpoint of productivity, 150 μm or less.

The growth face of the SiC single crystal obtained by the above solution method is a high-quality face with few defects such as dislocations. In such a case, the SiC single crystal thus obtained can be furnished directly to the next step, i.e., the step of bulk growing the SiC single crystal by a sublimation process or a gas process, after simply removing adhering solvent by surface treatment such as hydrofluoric nitric acid treatment and without otherwise carrying out any particular processing such as grinding. Moreover, to eliminate strain, defects and the like that arise due to processing in the SiC single crystal obtained by the solution process, such surface deterioration may be modified by carrying out, for example, ambient heat treatment.

Also, in the practice of this invention, it is possible to repeatedly use the SiC crucible and the Si—C solution in the production of SiC single crystals by the above-described solution method.

In this invention, a second SiC single crystal is then bulk grown by a sublimation process or a gas process on a face of the first SiC single crystal grown as described above by a solution process. It is possible in this way to bulk grow SiC by direct vapor-phase growth while maintaining the low-dislocation state of the first SiC single crystal grown by the above solution method.

Here, the bulk growth of the second SiC single crystal by a sublimation process entails placing a solid SiC starting material (generally a powder) at the bottom of a graphite crucible disposed within the production apparatus, heating the bottom of the crucible to a high temperature (at least 2,000° C., such as between 2,200° C. and 2,600°) to effect sublimation of the SiC, carrying out transport under an inert gas atmosphere within the apparatus, and then effecting recrystallization on the SIC seed crystal that has been set in a low-temperature region, thereby growing a bulk single crystal.

The bulk growth of a SiC single crystal by a gas process entails carrying out crystal growth by introducing silane ($SiH_4$) and a hydrocarbon gas (e.g., $C_2H_4$) from the exterior, as in a thin-film CVD process, onto a SiC seed crystal that has been heated to between about 2,100° C. and 2,300° C. The introduced gas reacts in a vapor phase, temporarily forming clusters which are introduced into a growth zone, where they again decompose, ultimately becoming the reaction precursors Si, $SiC_2$ and $Si_2C$ similar to those in a sublimation recrystallization process and inducing crystal growth on the SiC seed crystal to form a bulk single crystal.

Method for Suppressing Dislocations in a SiC Single Crystal

The inventive method for suppressing dislocations in a SiC single crystal is characterized by including the steps of forming a SiC crucible by rendering an alloy of silicon and a metallic element M that increases carbon solubility into a melt and impregnating the melt into a SiC sintered body having a relative density of from 50 to 90%; placing silicon and the metallic element M in the SiC crucible and heating the SiC crucible to melt the silicon and metallic element M within the crucible and form a Si—C solution; dissolving in the Si—C solution, from surfaces of the SiC crucible in contact with the Si—C solution, silicon and carbon making up the SiC crucible; and contacting a SiC seed crystal with a top portion of the Si—C solution to grow a first SiC single crystal on the SiC seed crystal by a solution process. The "solution process" here is the same as that described above.

It is possible in this way to suppress defects such as dislocations (reduce dislocations) on the growth face of the SiC single crystal.

Here, "dislocation" refers to threading dislocations (threading screw dislocations (TSD), threading edge dislocations (TED)) and basal plane dislocations (BPD). The degree of dislocation suppression (dislocation reduction) is assessed by employing the following alkali etching method or x-ray reflection topography to observe these dislocations and using the results to determine the number of dislocations (dislocation density).

<Alkali Etching Method>

A SiC crystal having a Si face that has been mirror polished to an arithmetic average roughness Ra (JIS B0601 (2001)) of not more than 10 nm is immersed for about 10 minutes in 500° C. molten KOH, and the threading dislocations (threading screw dislocations (TSD), threading edge dislocations (TED)) and basal plane dislocations (BPD) that appear on the Si face are observed as etching pits of different shapes. The number of dislocations per square centimeter (dislocation density) is determined by counting the dislocations observed in a plurality of fields under an optical microscope at a magnification of 100× on the examined surface following molten KOH treatment.

<X-Ray Reflection Topography>

Dislocations at the interior of the crystal are nondestructively examined from the refracted X-ray intensity when the surface of the sample is irradiated with S-rays at an acute angle using an X-ray topography system. Black dots in the resulting x-ray topograph are identified as threading screw dislocations (TSD) and wiry features as basal plan dislocations (BPD). The number of dislocations per square centimeter (dislocation density) is determined by counting the above dislocations observed in a field of view having a given surface area.

The inventive method for suppressing dislocations in a SiC single crystal preferably includes also the step of bulk growing a second SiC single crystal on a face of the solution-grown SiC single crystal by a sublimation process or a gas process. Here, the sublimation process and the gas process are the same as described above.

The bulk-grown SiC single crystal is thereby maintained in a low-dislocation state.

The inventive method for suppressing dislocations in a SiC single crystal more preferably includes also the steps of furnishing a SiC single-crystal wafer obtained from the second SiC single crystal bulk-grown by a sublimation process or a gas process for use as a seed crystal, and growing a third SiC single crystal by a solution process on the SiC seed crystal.

In this way, defects such as dislocations can be suppressed on the growth face of the SiC single crystal.

The inventive method for suppressing dislocations in a SiC single crystal even more preferably includes the step of bulk growing a fourth SiC single crystal on a face of the solution-grown SiC single crystal by a sublimation process or a gas process.

The bulk-grown SiC single crystal is thereby maintained in a lower dislocation state.

EXAMPLES

Examples and Comparative Examples are given below to more concretely illustrate the invention, although the invention is not limited by these Examples.

In these Examples, treatment of the samples and examination and evaluation of the samples, including the examination of dislocations, were carried out under the following conditions.

[Alkali Etching Method]

A SiC crystal having a Si face that was mirror polished to an arithmetic average roughness Ra (JIS B0601 (2001)) of not more than 10 nm was immersed for about 10 minutes in 500° C. molten KOH, and the threading dislocations (threading screw dislocations (TSD), threading edge dislocations (TED)) and basal plane dislocations (BPD) that appeared on the Si face were observed as etching pits of different shapes. Specifically, grinding was carried out from the seed crystal side (Si-face) toward the growth side (C-face), and an examination of dislocations in the thickness direction was carried out. The etch pits were differentiated as follows: relatively large hexagons were identified as threading screw dislocations (TSD), small hexagons were identified as threading edge dislocations (TED), and ellipses (tear-shaped pits) were identified as basal plane dislocations (BPD). Also, the dislocations observed in a plurality of fields under an optical microscope at a magnification of 100× on the examined surface following molten KOH treatment were counted, and the number of dislocations (dislocation density) was determined. It should be noted that etch pits develop only on the Si-face, and do not develop on the C-face. The reason why a mirror finish (Ra: 10 nm or less) is essential on the Si-face is that when grinding marks remain, they are enhanced by etching, making etch pit observation unclear.

[X-Ray Reflection Topography]

Using x-ray reflection topography, dislocations at the interior of a crystal were examined from the refracted X-ray intensity when the sample was irradiated with X-rays at an acute angle. A characteristic of this technique is that dislocations having a depth from the surface of up to 10 μm are reflected, enabling comparisons between thin films and samples of differing thicknesses. Because X-ray reflection topography is capable of nondestructive examination regardless of whether the surface examined is the Si-face and C-face, examination of the growth face where C-face growth has occurred is possible. Dislocations on the X-ray topograph are differentiated by identifying black dots as threading screw dislocations (TSD) and wiry features as basal plane dislocations (BPD). The XRT-micron, an X-ray topography system from Rigaku Corporation, was used in the Examples below.

[Raman Spectroscopy]

When matter is irradiated with light, interactions between the light and the matter give rise not only to reflection, refraction and absorption, but also to a phenomenon called scattering. One such scattering effect that is due to molecular vibrations is Raman scattering (inelastic scattering), whereby light is scattered at a wavelength different from that of the incident light. Raman spectroscopy is a spectroscopic method that measures the wavelength and scattering intensity of this Raman line, and carries out identification and quantification of the energy levels of matter and of matter. In the Examples, the SiC polytype was determined by analyzing Raman shifts in the Raman spectrum obtained by laser light irradiation.

[Hydrofluoric Nitric Acid Treatment]

Hydrofluoric nitric acid treatment involved immersing the sample for 6 hours at 250° C. or above in hydrofluoric nitric acid obtained by blending hydrofluoric acid, nitric acid and water in a 1:1:2 ratio, and thereby removing solvent and foreign matter adhering to the SiC crystal. Following treatment, the sample was ultrasonically cleaned with pure water and then dried.

[Direct Observation of Appearance]

The sample appearance was examined both visually by eye and also by capturing an image under LED light irradiation from above the crystal sample using a single-lens reflex camera (EOS-X7, from Canon Inc.) equipped with a macro lens (EFS 60 mm).

[Transmission Observation]

Transmission observation of the sample was carried out by capturing a transmission image under LED light irradiation from below the crystal sample using, as in direct observation of the appearance, a single-lens reflex camera (EOS-X7, from Canon Inc.) equipped with a macro lens (EFS 60 mm).

Example 1

The production of a SiC single crystal (crystal growth) was carried out with a production apparatus like that shown in FIG. 1 using a SiC sintered body in the shape of a crucible and having an outside diameter of 60 mm, a height of 70 mm, an inside diameter (cavity diameter) of 50 mm, a cavity height of 60 mm, a relative density of 80% and an oxygen content of 80 ppm. The crucible-shaped SiC sintered body was charged with a Pr—Fe—Si alloy (composition: Pr, 20 at %; Fe, 20 at %; Si, 60 at %) in an amount corresponding to the total pore volume of the SiC sintered body (equivalent to 20 vol % of the SiC sintered body) and 10 hours of heat treatment was carried out at 1,500° C. in an argon atmosphere, thereby impregnating the alloy into the pores of the SiC sintered body to form a SiC crucible 1. Next, Pr, Fe and Si were each charged as recombined metals such as to give the composition Pr 20 at %, Fe 20 at %, Si 60 at %; the amount was adjusted to give a Si—C solution depth, based on density calculations, of 27 mm. A 21 mm diameter×0.3 mm thick single crystal (polytype: 4H; on-axis, high grade) produced by the sublimation process and attached to a 19 mm diameter graphite seed shaft (rotary shaft 6) such that growth occurs on the C-face was used as the seed crystal 3. Crystal growth was carried for 5 hours at 2,000° C. in an argon atmosphere by rotating the SiC crucible 1 and the seed shaft (rotary shaft 6) at respective speeds of 20 rpm in opposite directions (one direction of rotation being clockwise and the other being counterclockwise) and pulling the ingot at a rate of 0.1 mm/hr.

Figure 4:
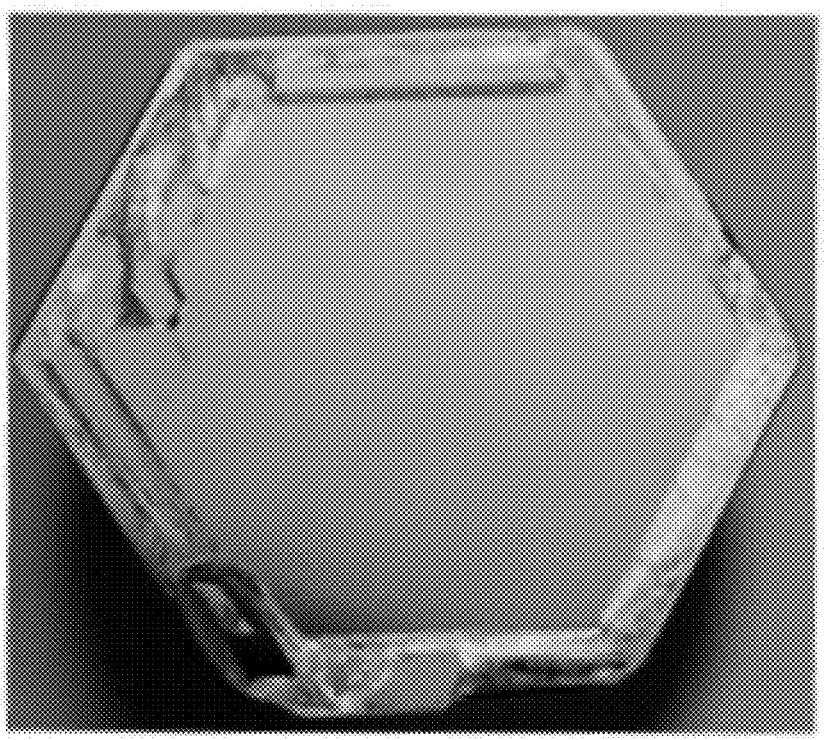
FIG. 4 is an image showing the appearance of the growth face (C-face) of the SiC single crystal obtained in Example 1.

FIG. 4 shows the appearance of the growth face (C-face), which is a plane perpendicular (orthogonal) to the seed axis direction, of the resulting SiC single crystal sample. The actual size of the photograph in FIG. 4 is 27 mm high and 23 mm wide. Upon evaluating the appearance of the resulting SiC single crystal, the growth face of the SiC single crystal shown in FIG. 4 was found to be a crystal without any polycrystal deposition thereon. The growth rate of the SiC single crystal was 180 μm/hr.

Figure 5:
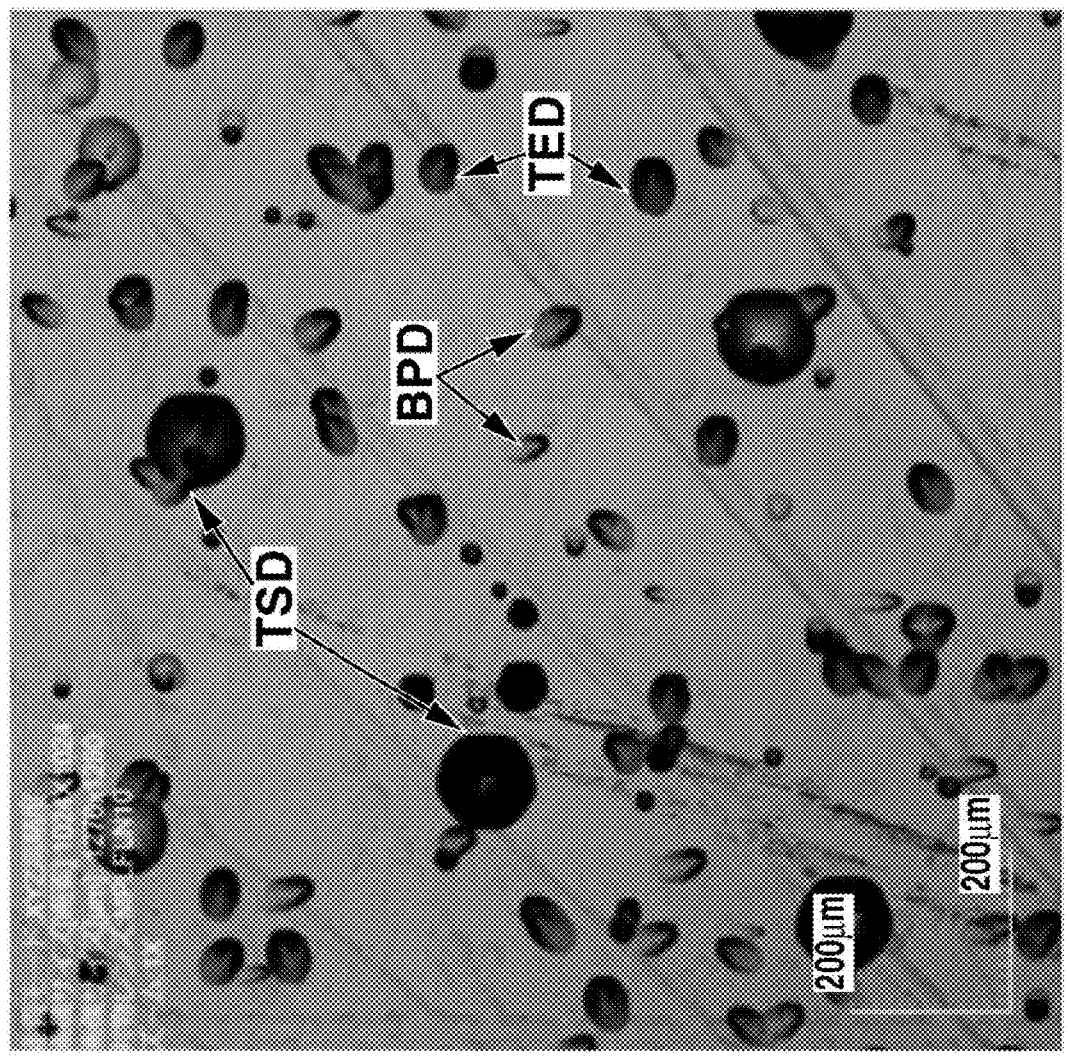
FIG. 5 is an image showing dislocation observation results in the seed crystal portion of the SiC single crystal sample in Example 1.
Figure 6:
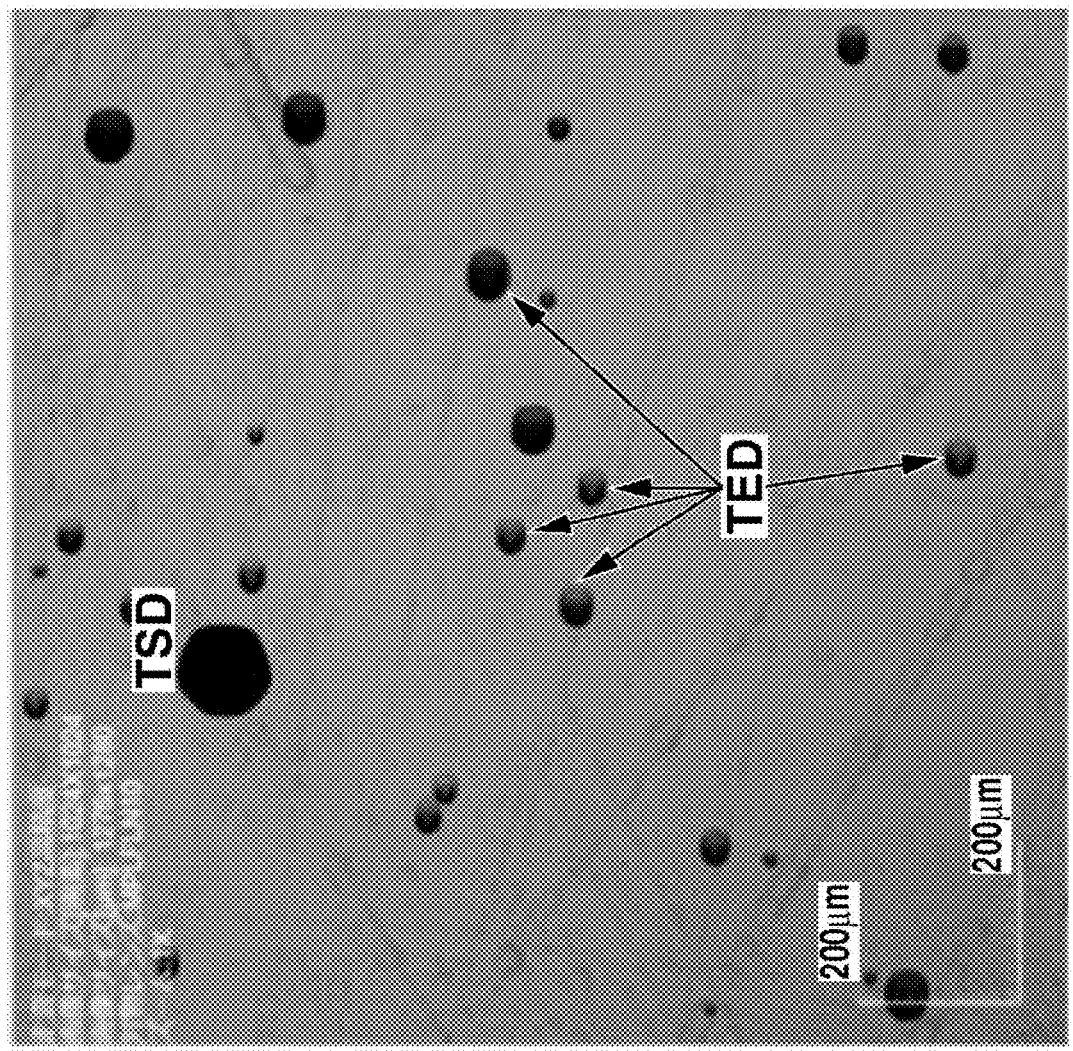
FIG. 6 is an image showing dislocation observation results in the solution growth portion (growth face) of the SiC single crystal sample in Example 1.

Grinding and polishing treatment so as to provide an inclination in the thickness direction were carried out from the crystal face (Si-face) side of the seed crystal portion of the resulting SiC single crystal sample and into the growth portion, creating an inclined face (Si-face) having a mirror-finished 2.6° angle of inclination. Next, etch pits were developed by the alkali etching method on this inclined face (Si-face), and the types and numbers of dislocations were examined (FIGS. 5 and 6). The dislocations can be differentiated as, respectively, threading screw dislocations (TSD), threading edge dislocations (TED) and basal plane dislocations (BPD) from these shapes and sizes. These dislocations are respectively designated as TSD, TED and BPD in FIGS. 5 and 6. These three types of dislocations were all counted in each of the regions on the inclined face of the SiC single crystal sample where observation was possible. The number of dislocations in the seed crystal portion (FIG. 5) was 5,152/cm$^2$ and the number of dislocations in the solution-grown portion (FIG. 6) was 952/cm$^2$, confirming a reduction in dislocations on account of the solution process. Moreover, in the solution-grown portion (FIG. 6), the number of basal plane dislocations (BPD), which are killer dislocations that are a cause of decreased yield during device fabrication, was 0/cm$^2$.

Example 2

The production of a SiC single crystal (crystal growth) was carried out with a production apparatus like that shown in FIG. 1 using a SiC sintered body in the shape of a crucible and having an outside diameter of 90 mm, a height of 70 mm, an inside diameter (cavity diameter) of 80 mm, a cavity height of 60 mm, a relative density of 80% and an oxygen content of 50 ppm. The crucible-shaped sintered body was charged with a Nd—Fe—Si alloy (composition: Nd, 20 at %; Fe, 20 at %; Si, 60 at %) in an amount corresponding to the total pore volume of the SiC sintered body (equivalent to 20 vol % of SiC sintered body) and 10 hours of heat treatment was carried out at 1,500° C. in an argon atmosphere, thereby impregnating the alloy into the pores of the SiC sintered body to form a SiC crucible 1. Next, Nd, Fe and Si were each charged as uncombined metals so as to give the composition Nd 20 at %, Fe 20 at %, Si 60 at %; based on density calculations, the amount was adjusted to give a Si—C solution depth of 27 mm. A 50 mm diameter×0.3 mm thick single crystal (polytype: 4H; on-axis, dummy grade) produced by the sublimation process and attached to a 49 mm diameter graphite seed shaft (rotary shaft 6) such that growth occurs on the C-face was used as the seed crystal 3. Crystal growth was carried for 2 hours at 2,000° C. in an argon atmosphere by rotating the SiC crucible 1 and the seed shaft (rotary shaft 6) at respective speeds of 5 rpm in opposite directions (one direction of rotation being clockwise and the other being counterclockwise) and pulling the ingot at a rate of 0.1 mm/hr.

Figure 7:
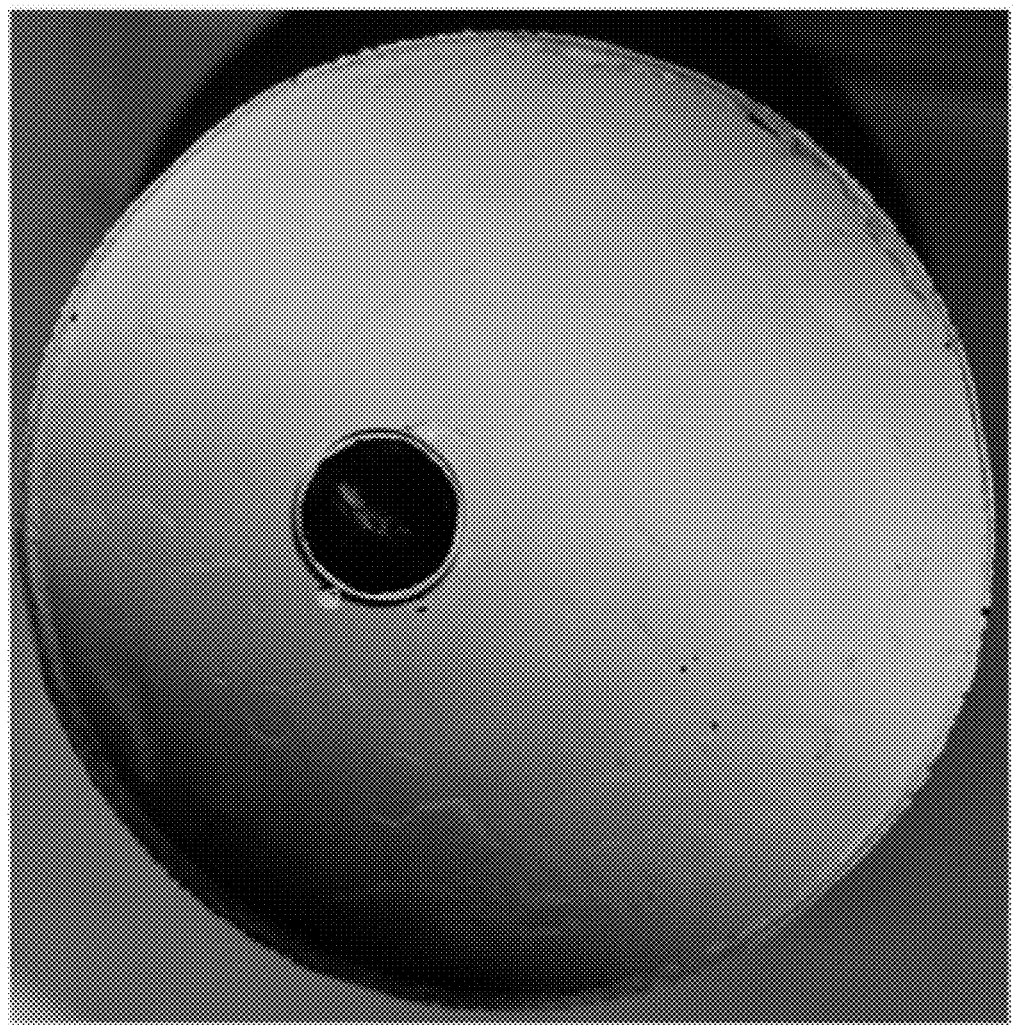
FIG. 7 is an image showing the appearance of the growth face (C-face) of the SiC single crystal in Example 2.

FIG. 7 shows the appearance of the growth face (C-face) of the resulting SiC single crystal sample. The actual size of the photograph in FIG. 4 is 51 mm high and 51 mm wide. Upon evaluating the appearance of the resulting SiC single crystal, the growth face of the SiC single crystal shown in FIG. 7 was flat and free of adhering polycrystals. In FIG. 7, the circular black portion is a region where, when the crystal-grown seed crystal is separated from the Si—C solution following the completion of crystal growth, some Si—C solution adheres to the growth face and forms a protruding liquid drop; this region is not the target of evaluation (the same applies to the black portions in FIGS. 10 and 15 below). The SiC single crystal grew to a thickness of 300 μm in 2 hours, and so the growth rate was 150 μm/hr.

Figure 8:
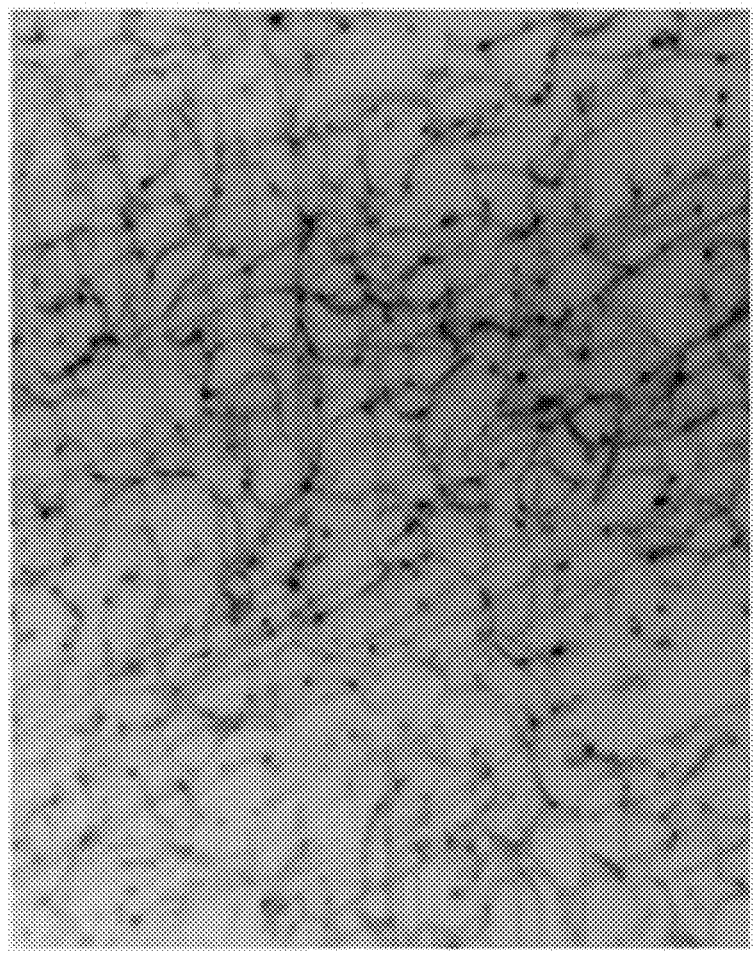
FIG. 8 is an X-ray reflection topograph of the seed crystal portion of the SiC single crystal sample in Example 2.
Figure 9:
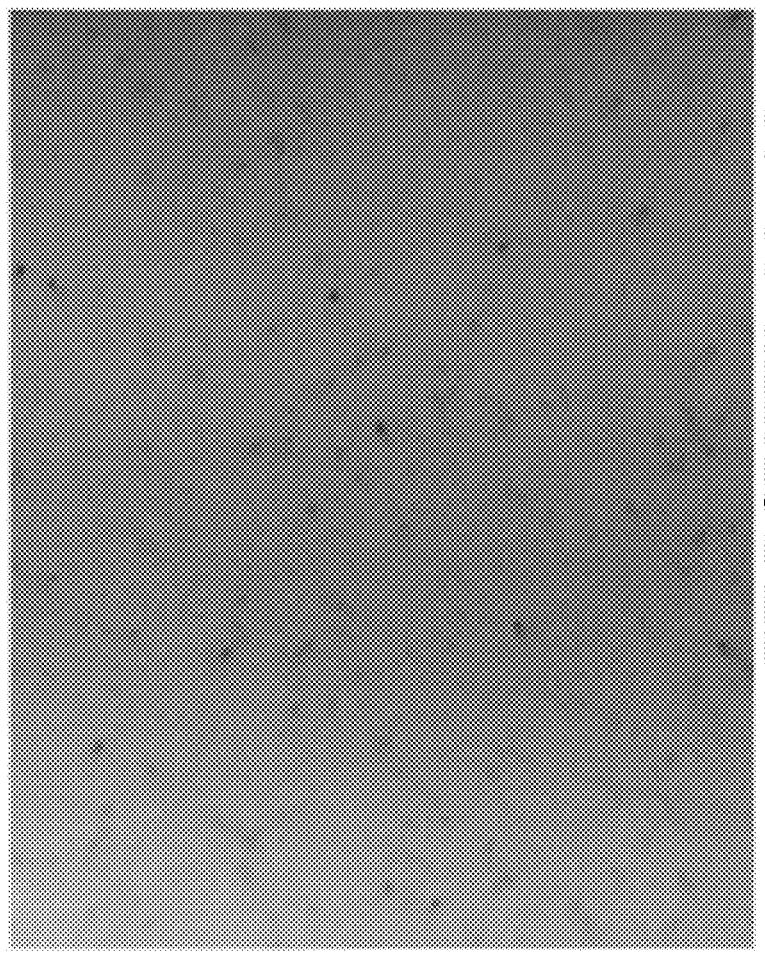
FIG. 9 is an X-ray reflection topograph of the solution growth portion (growth face) of the SiC single crystal sample in Example 2.

The crystal face (Si-face) of the seed crystal portion and the crystal face (i.e., growth face, (C-face)) of the solution-grown portion of the resulting SiC single crystal sample were each ground so as to remove 100 μm of material, following which they were polished, thereby mirror finishing the surfaces. The dislocations on the polished faces were then examined by x-ray reflection topography (FIGS. 8 and 9). As a result, the solution-grown portion (FIG. 9) had fewer dislocations than the seed crystal portion (FIG. 8), confirming a reduction in the number of dislocations due to the solution process. Of the dislocations observed the black dots in FIGS. 8 and 9 are threading dislocations (TSD, TED), and the wiry features are basal plane dislocations (BPD). Here, the SiC wafer used as the seed crystal had numerous dislocations and was of a dummy grade that cannot be used in devices, but carrying out growth by the solution process reduced the number of dislocations in the SiC single crystal. The threading screw dislocations (TSD), threading edge dislocations (TED) and basal plane dislocations (BPD) were all counted in every field of view (2.1 mm×1.6 mm regions) on the polished face of the SiC single crystal sample, whereupon, in the solution grown portion (FIG. 9), the number of basal plane dislocations (BPD), which have a large effect on yield in device fabrication, was 0/cm$^2$ and the number of other dislocations also greatly decreased. That is, the number of dislocations in the seed crystal portion (FIG. 8) was 50,115/cm$^2$, whereas the number of dislocations in the solution-grown portion (FIG. 9) was 1,144/cm$^2$, representing a decrease of about 98%. In addition, it was apparent from these results that even a SiC wafer which contains numerous dislocations and cannot be used in this condition in device fabrication, when subjected to crystal growth by the solution process using this as the seed crystal, can be regenerated as a high-quality SiC single crystal wafer that may be used directly in device fabrication or may be used as a seed crystal (substrate) for a vapor phase growth process such as a sublimation process or a gas process.

Example 3

Next, solution growth was carried out in a case where the SiC single crystal seed crystal was off-axis (the (0001) Si-face was slightly inclined in a specific direction (the [11-20] direction) from the surface normal).

That is, a SiC single crystal having a diameter of 50 mm and a thickness of 0.3 mm (polytype: 4H; 4° off-axis; dummy grade) and attached to a 49 mm diameter graphite seed shaft such that growth occurs on the C-face was used as the seed crystal 3. Aside from this, the SiC crucible and the metal ingredients (composition) placed in the SiC crucible 1 were the same as in Example 2, and production of a SiC single crystal (crystal growth) was carried out with a production apparatus like that shown in FIG. 1. At this time, crystal growth was carried for 2 hours at 2,000° C. in an argon atmosphere by rotating the SiC crucible 1 and the seed shaft (rotary shaft 6) at respective speeds of 5 rpm in opposite directions (one direction of rotation being clockwise and the other being counterclockwise) and pulling the ingot at a rate of 0.1 mm/hr.

Figure 10:
FIG. 10 is an image showing the appearance of the growth face (C-face) of the SiC single crystal in Example 3.
Figure 11:
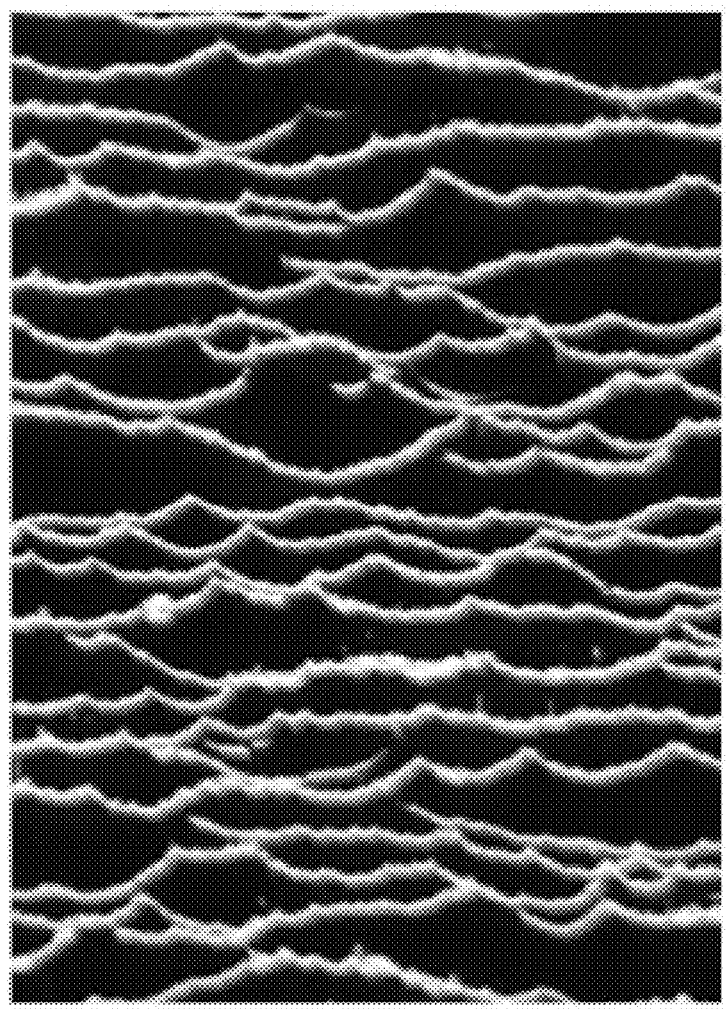
FIG. 11 is a laser micrograph of the growth face (C-face) of the SiC single crystal sample in Example 3.

FIG. 10 shows the appearance of the growth face (C-face) of the resulting SiC single crystal sample. The actual size of the photograph in FIG. 10 is 51 mm high and 51 mm wide. Upon evaluating the appearance of the resulting SiC single crystal, the growth face of the SiC single crystal was flat and free of adhering polycrystals.

The growth face of the SiC single crystal was examined with a laser microscope (magnification: 5×), whereupon macrostep formation toward the off-axis direction [11-20] on the C-face (000-1) was confirmed.

Figure 12:
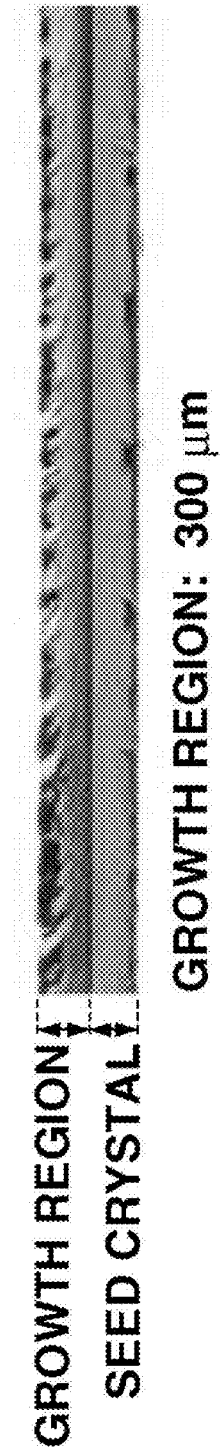
FIG. 12 is an image showing a cross-section of the SiC single crystal sample in Example 3.

Next, to examine the crystal cross-section of the SiC single crystal sample, the sample was sliced parallel to the off-axis direction [11-20] and perpendicular to the C-face (000-1), and cross-sectional examination was carried out. As a result, of the total 300-μm thickness of the solution-grown portion, entrapment of a Si—C solution ingredient (also referred to below as simply "the solvent") in the solution grown portion (here, "entrapment" refers to the inadvertent inclusion of a Si—C solution ingredient in the solution-grown portion) to a thickness on the surface layer side of at least 150 μm was confirmed (FIG. 12). This is presumably because, owing to growth to an off-axis SiC single crystal (off-axis substrate), macrostep formation occurred, facilitating solvent entrapment. The crystal cross-section shown in FIG. 12 is a transmission image taken with a single-lens reflex camera (EOS-X7, from Canon Inc.) equipped with a macro lens (EFS 60 mm) under LED white light irradiation from below the crystal sample.

Figure 13:
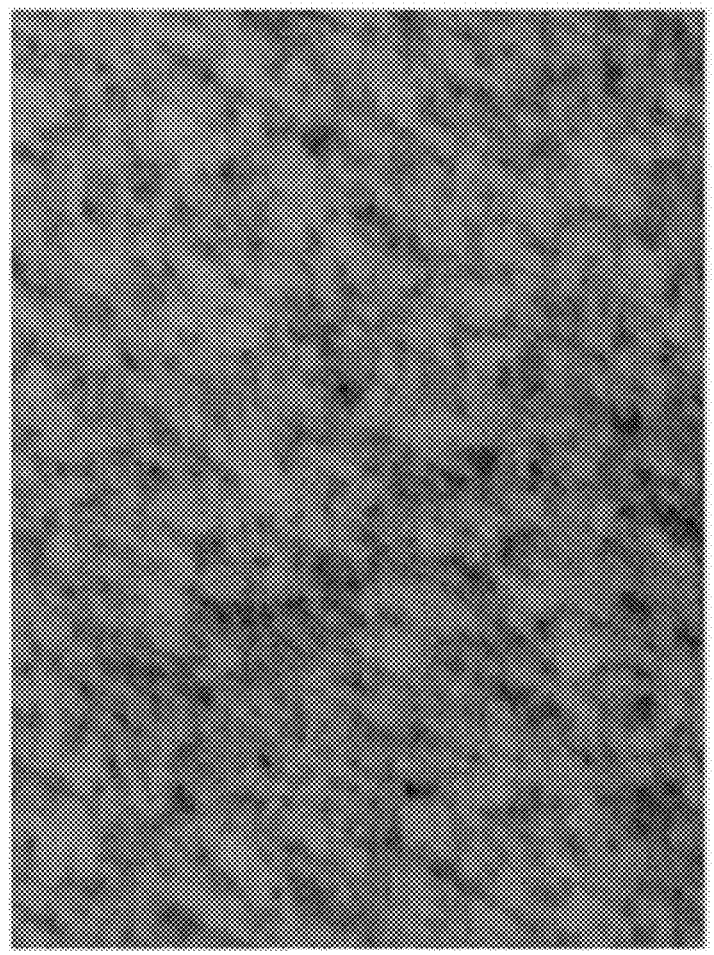
FIG. 13 is an X-ray reflection topograph of the seed crystal portion of the SiC single crystal sample in Example 3.
Figure 14:
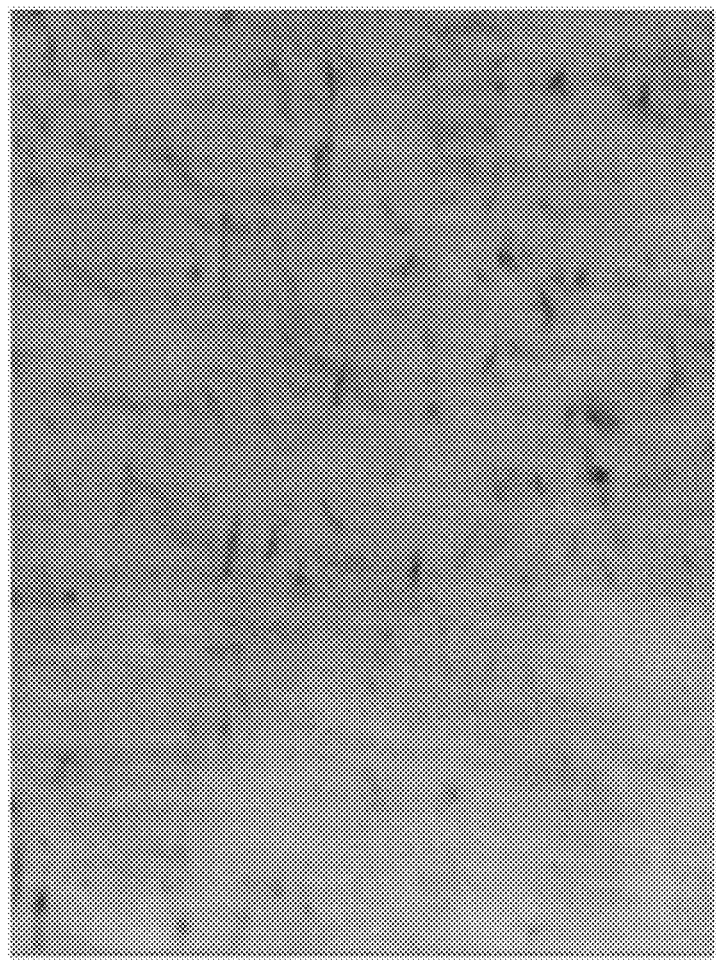
FIG. 14 is an X-ray reflection topograph of the solution growth portion (growth face) of the SiC single crystal sample in Example 3.

However, although there was solvent entrapment in the resulting SiC single crystal sample, the growth thickness of the SiC single crystal was 300 μm in 2 hours, and so the growth rate was 150 μm/hr. Because normal crystal was obtained up to a thickness of 150 μm on the seed crystal side of the solution grown portion, grinding that removed a 200 μm thick portion of material from the crystal face of the solution grown portion was carried out and grinding that removed a 100 μm thick portion of material from the crystal face of the seed crystal portion was carried out, following which polishing treatment was carried out, giving the surfaces a mirror finish (arithmetic average roughness Ra: 10 μm or less). These polished faces were then examined for dislocations by x-ray reflection topography (FIGS. 13 and 14). The solution grown portion (FIG. 14) was found to have few dislocations compared with the seed crystal portion (FIG. 13), confirming a reduction in dislocations owing to the solution process. The SiC wafer used here as the seed crystal had numerous dislocations and was a dummy grade that could not be used in devices, but the dislocations were reduced through solution growth by the solution process.

Threading screw dislocations (TSD), threading edge dislocations (TED) and basal plane dislocations (BPD) were all counted in every field-of-view region (2.1 mm×1.6 mm regions) on the polished face of the SiC single crystal sample, whereupon, in the solution grown portion (FIG. 14), basal plane dislocations (BPD), which are killer dislocations having a large impact on yield in device fabrication, numbered $0/cm^2$ and other dislocations were also greatly reduced in number. That is, the number of dislocations in the seed crystal portion (FIG. 13) was $29,762/cm^2$, whereas the number of dislocations in the solution grown portion (FIG. 14) was 4,062 $cm^2$, a reduction of about 86%.

Comparative Example 1

The production of a SiC single crystal (crystal growth) was carried out with a production apparatus like that shown in FIG. 1 using a graphite crucible having an outside diameter of 90 mm, an inside diameter of 80 mm, an outside height of 90 mm and an inside height of 90 mm. The graphite crucible was charged with Nd, Fe and Si, each as the uncombined metal, such that the composition becomes Nd 16 at %, Fe 20 at %, Si 64 at %, and the amount was adjusted to a Si—C solution depth of 27 mm based on density calculations. A 50 mm diameter×0.3 mm thick single crystal (polytype: 4H; on-axis, dummy grade) attached to a 49 mm diameter graphite seed shaft in such a way that growth occurs on the C-face was used as the seed crystal. Crystal growth was carried for 2 hours at 2,000° C. in an argon atmosphere by rotating the crucible and the seed shall at respective speeds of 5 rpm in opposite directions (one direction of rotation being clockwise and the other being counterclockwise) and pulling the ingot at a rate of 0.1 mm/hr.

The growth thickness of the SiC single crystal sample thus obtained was 300 μm in 5 hours, representing a growth rate of 60 μm/hr. This was lower than in Example 2, where the growth rate was 150 μm/hr.

Figure 15:
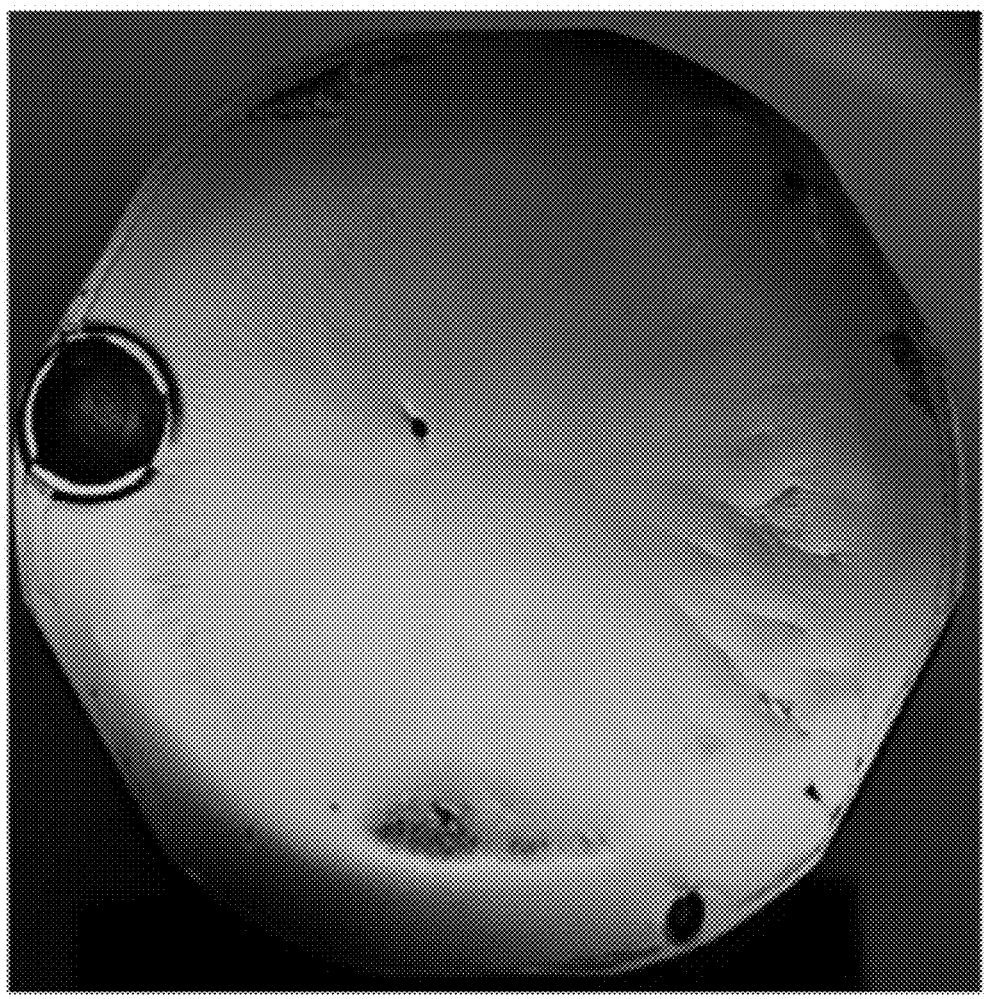
FIG. 15 is an image showing the appearance of the growth face (C-face) of the SiC single crystal in Comparative Example 1.

FIG. 15 shows the appearance of the growth face (C-face) on the resulting SiC single crystal sample. The actual size of the photograph in FIG. 15 is 51 mm high and 51 mm wide. When the appearance of the SiC single crystal obtained here was compared with that of the SiC single crystal sample in Example 2 (FIG. 7), abnormalities on the growth face were observed in neither sample.

Figure 16:
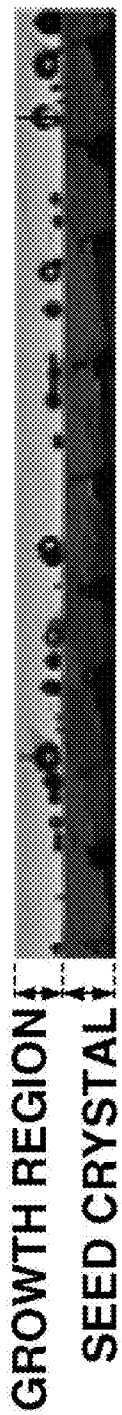
FIG. 16 is an image showing a cross-section of the SiC single crystal sample in Comparative Example 1.
Figure 17:
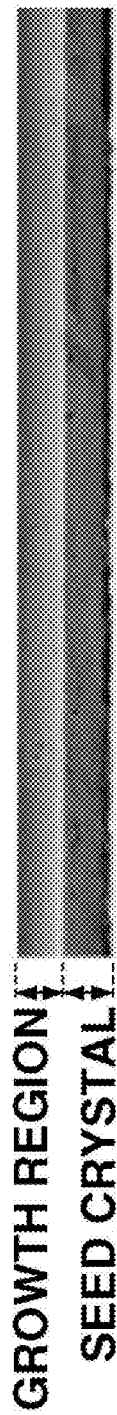
FIG. 17 is an image showing a cross-section of the SiC single crystal sample in Example 2.

Next, in order to examine the crystal cross-section of the SiC single crystal sample, the sample was sliced perpendicular to the growth face (C-face) and polished, following which cross-sectional examination was carried out. The SiC single crystal sample obtained in Example 2 was similarly prepared and cross-sectionally examined. As a result, in Comparative Example 1 (FIG. 16), numerous voids were observed within the solution growth portion in the vicinity of the seed crystal, whereas no voids whatsoever were observed in the solution growth portion in Example 2 (FIG. 17). This is presumably on account of the evolution, at the initial stage of growth, of gaseous ingredients (oxygen, nitrogen, etc.) present in the graphite crucible, hampering normal solution growth. By contrast, in the present invention, because a crucible-shaped SiC sintered body having a low oxygen content (oxygen content, 50 ppm) is used, crystal growth appears to be stably carried out from the initial stage of growth without gas evolution from the crucible. Based on these results, when a graphite crucible is used, from 200 to 300 μm thicker growth is necessary in order to obtain a normal crystal growth face, which is disadvantageous from the standpoint of mass production. In addition, further difficulties are anticipated in growth using as the seed crystal an off-axis SiC single crystal (off-axis substrate), wherein solvent readily becomes trapped in the solution growth portion. Because the SiC seed crystals used in vapor phase processes are for the most part 4° off-axis substrates, void generation early in growth is indeed a critical problem.

Example 4

The SiC crucible used in the invention (i.e., a SiC crucible obtained by impregnating an SiC sintered body having a relative density of from 50 to 90% with a molten alloy of silicon and a metallic element M that increases the solubility of carbon) is suitable for growth over an extended period of time because the composition of the Si—C solution (solvent) does not fluctuate. Also, the time required for low-dislocation SiC crystal growth using the SiC crucible of the invention is about 1 to 2 hours. Therefore, the possibility of making repeated use of the SiC crucible and Si—C solution (solvent) employed in this invention was investigated with mass production in mind.

The method of investigation involved repeatedly carrying out crystal growth of a SiC single crystal under the same conditions as in Example 2 without replacing the SiC crucible and Si—C solution (solvent), i.e., using the same Si—C crucible and Si—C solution successively as is without replacement, and ascertaining the effect on the crystal quality of the resulting SiC single crystal samples.

That is, crystal growth of a SiC single crystal was carried out repeatedly (5 times) and the crystal quality of the SiC single crystal sample obtained each time was evaluated. The evaluation methods carried out were an examination of the outside appearance of the crystal (to determine the presence or absence of polycrystal deposition and abnormal growth (e.g., two-dimensional nuclear growth)) and determination of the growth rate, both performed in the same way as in Example 2, an examination of solvent entrapment (cross-sectional examination) carried out in Comparative Example 1, and an examination of the crucible appearance. Those results are presented in Table 1.

TABLE 1

| Crystal growth runs | Growth rate (μm/hr) | Appearance examination | | Cross-sectional examination Solvent entrapment | Crucible appearance |
| --- | --- | --- | --- | --- | --- |
| | | Poly-crystal deposition | Ab-normal growth | | |
| First run | 150 | no | no | no | normal |
| Second run | 145 | no | no | no | normal |
| Third run | 130 | no | no | no | normal |
| Fourth run | 125 | no | no | no | normal |
| Fifth run | 125 | no | no | no | normal |

From these results, a decline in the growth rate as the number of crystal growth repetitions increases was confirmed, but because the outside appearance and cross-sectional appearance of the SiC single crystal sample posed no problem and the crucible also was normal, about five crystal growth runs was confirmed to be possible. The cause for the decline in the growth rate is thought to be that the SiC polycrystal which forms within the crucible following crystal growth consumes the carbon that is supplied to the seed crystal (SiC single crystal). Thinking in terms of efficiency, if one were to build a continuous growth system that could, following crystal growth, carry out the next crystal growth without cooling of the Si—C solution within the crucible, a further increase in the number of repeated crystal growth runs and stable crystal growth should be possible.

Comparative Example 2

SiC single crystal growth was carried out under the same conditions as in Comparative Example 1, except that crystal growth was repeatedly carried out using the same graphite crucible and the Si—C solution (solvent) successively as is without replacement. Evaluations were carried out in the same way as in Example 4. The results are presented in Table 2.

TABLE 2

| Crystal growth runs | Growth rate (μm/hr) | Appearance examination | | Cross-sectional examination Solvent entrapment | Crucible appearance |
| --- | --- | --- | --- | --- | --- |
| | | Poly-crystal deposition | Ab-normal growth | | |
| First run | 60 | no | no | no | normal |
| Second run | 34 | yes | no | no | cracks appeared |

From these results, in the first crystal growth run, polycrystal deposition on the SiC single crystal sample was not observed, but polycrystal deposition arose in the second run. Also, because cracking occurred in the graphite crucible during the second crystal growth run, the repetition of crystal growth was discontinued at this point. Repeated use of the Si—C solution (solvent) in a graphite crucible appears to pose a problem. Also, in Comparative Example 2, the growth rate in the second crystal growth run decreased 57% relative to the growth rate in the first run. This is presumably because, following the first crystal growth run, the Si—C solution (solvent) cooled and SiC precipitated in a form that covered the graphite crucible wall, hindering carbon dissolution from the crucible at the time of the second crystal growth run. By contrast, in Example 4, because the Si—C solution (solvent) composition was adjusted with the knowledge that SiC would dissolve out of the crucible, the decrease in the growth rate was small.

As demonstrated above, high-quality SiC single crystals can be stably and efficiently produced by repeatedly using the SiC crucible (i.e., a SiC crucible obtained by impregnating a SiC sintered body having a relative density of from 50 to 90% with a molten alloy of silicon and a metallic element M which increases the carbon solubility) and the Si—C solution (solvent) employed in this invention.

Example 5

(i) Crystal Growth by Solution Process

The production of a SiC single crystal (crystal growth) was carried out with a production apparatus like that shown in FIG. 1 using a SiC sintered body in the shape of a crucible and having an outside diameter of 180 mm, a height of 60 mm, an inside diameter (cavity diameter) of 150 mm, a cavity height of 40 mm, a relative density of 80% and an oxygen content of 40 ppm. The crucible-shaped sintered body was charged with a Nd—Fe—Si alloy (composition: Nd, 20 at %; Fe, 20 at %; Si, 60 at %) in an amount corresponding to the total pore volume of the SiC sintered body (equivalent to 20 vol % of the SiC sintered body) and 10 hours of heat treatment was carried out at 1,500° C. in an argon atmosphere, thereby impregnating the alloy into the pores of the SiC sintered body to form a SiC crucible 1. Next, Nd, Fe and Si were each charged as uncombined metals such as to give the composition Nd 20 at %, Fe 20 at %, Si 60 at %; the amount was adjusted to give a Si—C solution depth, based on density calculations, of 27 mm. A 100 mm diameter×1 mm thick single crystal (polytype: 4H; 4° off-axis, dummy grade) attached to a 99 mm diameter graphite seed shaft (rotary shaft 6) in such a way that growth occurs on the C-face was used as the seed crystal 3. Crystal growth was carried for 1 hour at 2,000° C. in an argon atmosphere by rotating the SiC crucible 1 and the seed shaft (rotary shaft 6) at respective speeds of 5 rpm in opposite directions (one direction of rotation being clockwise and the other being counterclockwise) and pulling the ingot at a rate of 0.1 mm/hr. Dislocation observation by x-ray reflection topography was carried out beforehand on the C-face of the seed crystal to be used.

Figure 18:
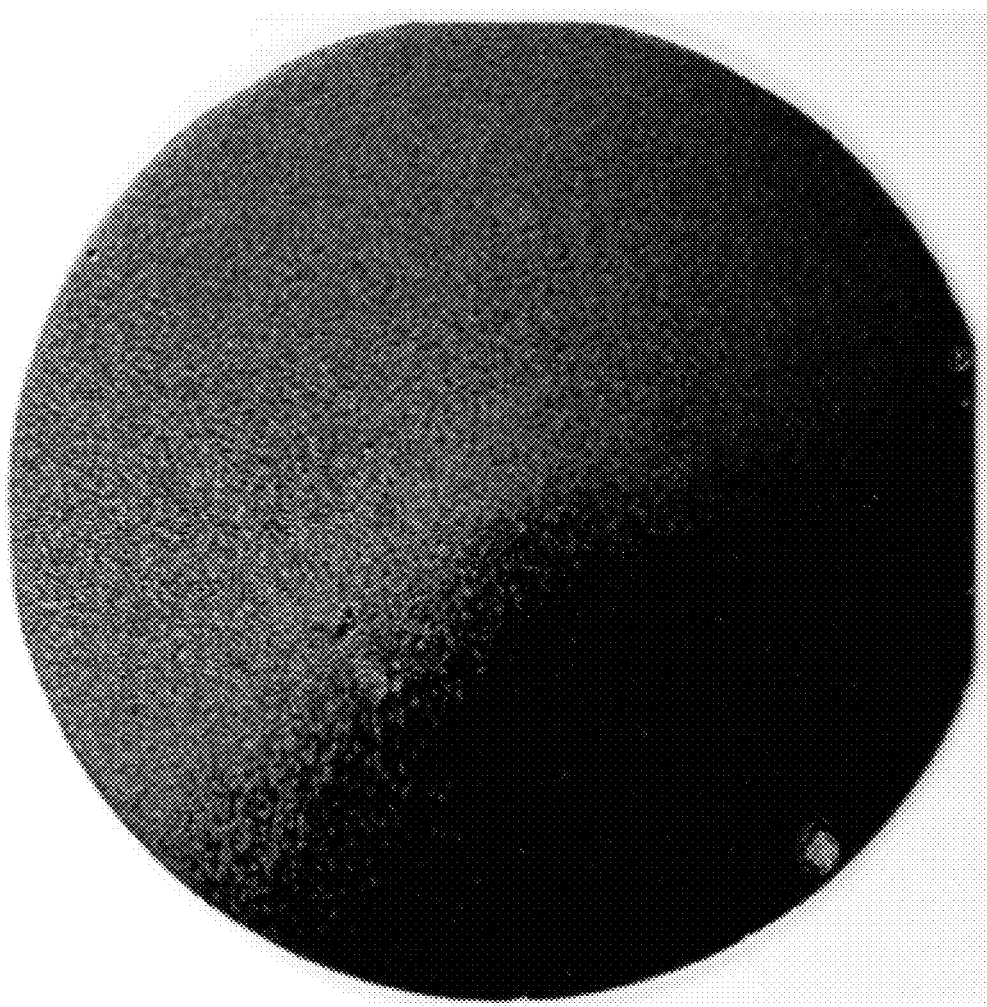
FIG. 18 is an image showing the appearance of the growth face (C-face) of the SiC single crystal in Example 5.

The resulting SiC single crystal sample (1) was evaluated, whereupon the crystal face (growth face (C-face)) of the solution growth portion of the SiC single crystal sample shown in FIG. 18 had, as in Example 3, a mirror-like appearance with macrosteps uniformly formed toward the [11-20] direction on the C-face (000-1).

The polytype of the resulting SiC single crystal sample was identified by Raman spectroscopy, and was confirmed to be 4H-SiC throughout.

The growth thickness of the solution grown portion of the SiC single crystal sample was 100 μm in one hour, and so the growth rate was 100 μm/hr.

Next, hydrofluoric nitric acid treatment was carried out on the SiC single crystal sample (1) thus obtained, and ultrasonic cleaning and drying were subsequently carried out, thereby removing solvent ingredients adhering to the growth face, following which dislocations on the solution growth face (C-face) were examined by x-ray reflection topography. Threading screw dislocations (TSD), threading edge dislocations (TED) and basal plane dislocations (BPD) were all counted in every the field-of-view region (2.1 mm×1.6 mm regions), whereupon, in the solution growth portion, the basal plane dislocations (BPD), which are killer dislocations with a large impact on yield in device fabrication, was $0/cm^2$ and other dislocations were also greatly reduced. That is, the number of dislocations in the seed crystal portion was $32,506/cm^2$, whereas it was confirmed that the number of dislocations in the solution growth portion decreased to $4,020/cm^2$. These results demonstrate that the present invention is able, even in large-diameter solution growth, to carry out uniform crystal growth.

(ii) Bulk Growth by Sublimation Process

Next, using this SiC single crystal sample (1) in which the number of dislocations decreased to $4,020/cm^2$ as the seed crystal, bulk growth by the sublimation process was carried out as described below.

Figure 19:
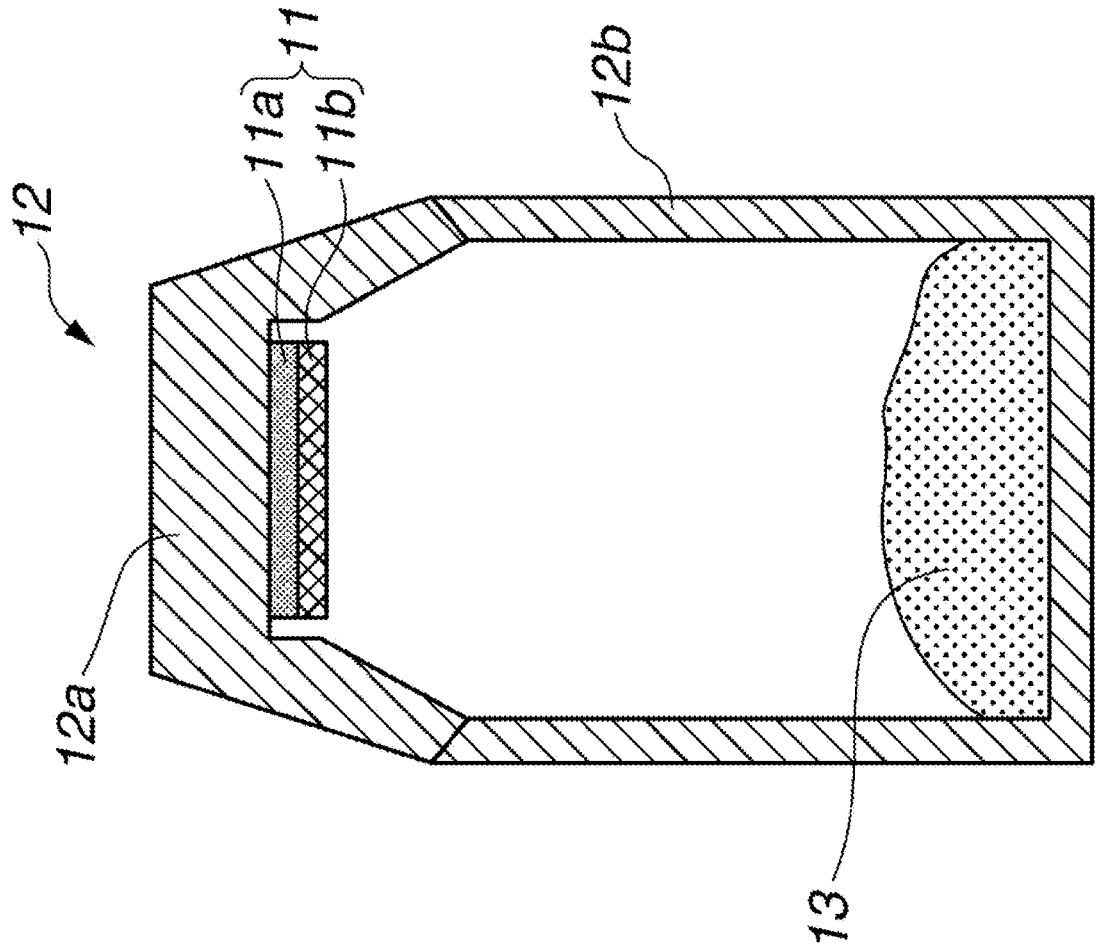
FIG. 19 is a schematic cross-sectional view of the reaction vessel during bulk growth by a sublimation process.

This SiC single crystal sample (seed crystal) 11 was set at the top (inside wall of top cover 12a)) of the reaction vessel 12 shown in FIG. 19 such that the solution growth portion 11b faces downward, SiC powder 13 as the starting material was placed directly below, and this reaction vessel 12 was installed in the sublimation reactor 20 shown in FIG. 20.

Figure 20:
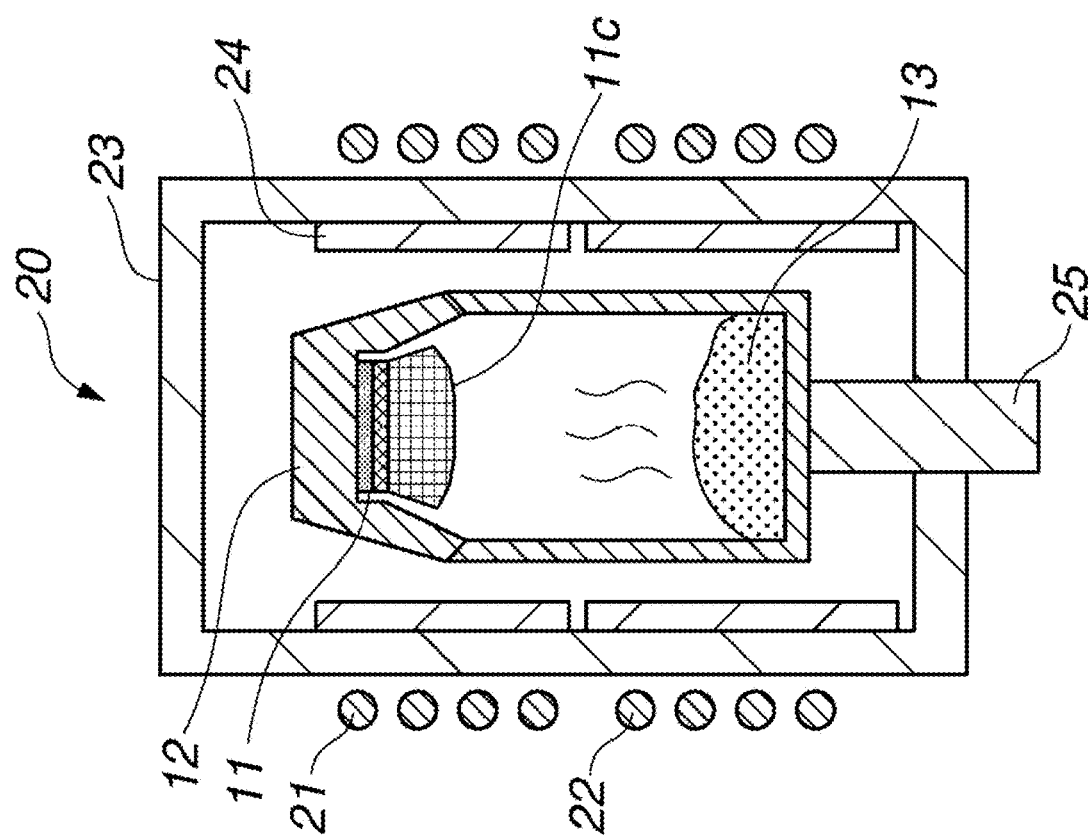
FIG. 20 is a schematic cross-sectional view of the reaction apparatus during bulk growth by a sublimation process.

Ordinary conditions were used in SiC growth in the sublimation reactor 20 in FIG. 20. Specifically, the starting material temperature was set to between 2,200° C. and 2,500° C., the seed crystal temperature was set to between 2,100° C. and 2,400° C., the temperature gradient was set to from 1° C./cm to 50° C./cm, the pressure was set to from 100 to 5,000 Pa (argon atmosphere), and the growth rate was set to from 0.05 to 0.2 mm/hr.

The growth thickness of the resulting SiC single crystal (SiC ingot) sample (2) was 5 mm. This was sliced, following which grinding and polishing were carried out, giving four 1 mm thick wafers. Dislocation observation by x-ray reflection topography was carried out in the same way as described above on the wafers, as a result of which the number of dislocations was found to be from 4,210 to $4,400/cm^2$.

In addition, this wafer (number of dislocations, $4,210/cm^2$) was again subjected to solution growth under the conditions in (i) above, giving a SiC single crystal sample (3).

The crystal face of the resulting SiC single crystal sample (3) was subjected to x-ray reflection topography in the same way as described above, and the threading screw dislocations (TSD), threading edge dislocations (TED) and basal plane dislocations (BPD) were all counted. In the solution growth portion, the basal plane dislocations (BPD), which are killer dislocations with a large impact on yield in device fabrication, was $0/cm^2$ and the other dislocations were also greatly reduced, the number of dislocations being $590/cm^2$.

Next, using this SiC single crystal sample (4) as the seed crystal, bulk growth was again carried out by the sublimation process under the conditions in (ii) above, giving SiC single crystal sample (5).

Dislocation observation was carried out on the resulting SiC single crystal sample (5) by x-ray reflection topography in the same way as described above, whereupon the number of dislocations was 625 to $643/cm^2$. The reason for the increase in the number of dislocations compared with the above SiC single crystal sample (4) is likely because dislocations re-converted or newly formed in bulk growth by the sublimation process.

From the above results, it is apparent that carrying out solution growth to a thickness of about 100 μm by the solution method of the invention on a seed crystal produced by the sublimation process (SiC wafer) reduces dislocations, and moreover that even when bulk growth is carried out by the sublimation process using this as the seed crystal (substrate), a low dislocation state is maintained. These results also demonstrate that when solution growth is again carried out by the solution process of the invention on a bulk-grown SiC single crystal in a low dislocation state, the dislocations are further reduced, and that by utilizing this as the seed crystal, bulk growth that maintains an even further reduced dislocation state is possible.

Japanese Patent Application No. 2021-147017 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

DESCRIPTION OF REFERENCE SIGNS

1: SiC crucible
2: Second crucible
3: SiC single crystal (seed crystal)
4: Si—C solution
5, 6: Rotary shafts
7: Susceptor
8: Heat shield
9: Top cover
10: Rf coil
11: Seed crystal
11a: Seed crystal portion
11b: Solution growth portion
11c: Grown SiC single crystal
12: Reaction vessel
12a: Top cover
12b: Carbon vessel
13: SiC powder
20: Sublimation reactor
21: Rf coil 1
22: Rf coil 2
23: Heat shield
24: Insulator
25: Elevating stage

The invention claimed is:

1. A method for producing a SiC single crystal, comprising the steps of, in order:
   forming a SiC crucible by rendering an alloy into a melt, wherein the alloy includes silicon and a constituent metallic part M referred to as a metallic element M that increases carbon solubility, and impregnating the melt into a SiC sintered body having a relative density of from 50 to 90%,
   wherein the metallic element M comprises:
   (1) at least one first metallic element M1 selected from the group consisting of La, Ce, Pr, Nd, Sm, Eu, Gd, Tb, Dy, Ho, Y and Lu; and
   (2) (i) at least one second metallic element M2 selected from the group consisting of Ti, V, Cr, Mn, Fe, Co, Ni and Cu, (ii) at least one third metallic element M3 selected from the group consisting of Ga, Ge, Sn, Pb and Zn, or (iii) at least one second metallic element M2 and at least one third metallic element M3, placing silicon and the metallic element M in the SiC crucible and heating the crucible to melt the silicon and metallic element M within the crucible and form a Si—C solution, dissolving in the Si—C solution, from surfaces of the SiC crucible in contact with the Si—C solution, silicon and carbon making up the SiC crucible, contacting a SiC seed crystal with a top portion of the Si—C solution to grow a first SiC single crystal on the SiC seed crystal by a solution process, and bulk growing a second SiC single crystal on a face of the solution-grown first SiC single crystal by a sublimation process or a gas process.

2. The production method of claim 1, wherein the total content of the metallic element M in the Si—C solution is from 1 to 80 at % of the combined amount of silicon and the metallic element M.

3. The production of claim 1, wherein the content of the first metallic element M1 in the Si—C solution is at least 1 at % of the combined amount of silicon and the metallic element M, and the contents of the second metallic element M2 and the third metallic element M3 in the Si—C solution are each at least 1 at % of the combined amount of silicon and the metallic element M.

4. The production method of claim 1, wherein the SiC sintered body has an oxygen content of 100 ppm or less.

5. The production method of claim 1, wherein growth of the first SiC single crystal by a solution process is carried out at a Si—C solution temperature of between 1,300 and 2,300° C.

6. The production method of claim 1, wherein production is carried out with the SiC crucible held within a second crucible made of a heat-resistant carbon material.

7. The production method of claim 1, wherein the first SiC single crystal grown by a solution process has a thickness of from 10 to 1,000 µm.

8. The production method of claim 1, wherein the SiC crucible and the Si—C solution are used repeatedly.

9. The production method of claim 1, wherein the growth rate of the first SiC single crystal grown by a solution process is 100 µm/hr or more.

10. A method for suppressing dislocations in a SiC single crystal, comprising the steps of, in order:

forming a SiC crucible by rendering an alloy into a melt, wherein the alloy includes silicon and a constituent metallic part M referred to as a metallic element M that increases carbon solubility, and impregnating the melt into a SiC sintered body having a relative density of from 50 to 90%, wherein the metallic element M comprises:

(1) at least one first metallic element M1 selected from the group consisting of La, Ce, Pr, Nd, Sm, Eu, Gd, Tb, Dy, Ho, Y and Lu; and (2) (i) at least one second metallic element M2 selected from the group consisting of Ti, V, Cr, Mn, Fe, Co, Ni and Cu, (ii) at least one third metallic element M3 selected from the group consisting of Ga, Ge, Sn, Pb and Zn, or (iii) at least one second metallic element M2 and at least one third metallic element M3, placing silicon and the metallic element M in the SiC crucible and heating the SiC crucible to melt the silicon and metallic element M within the crucible and form a Si—C solution, dissolving in the Si—C solution, from surfaces of the SiC crucible in contact with the Si—C solution, silicon and carbon making up the SiC crucible, and contacting a SiC seed crystal with a top portion of the Si—C solution to grow a first SiC single crystal on the SiC seed crystal by a solution process.

11. The method of claim 10, further comprising the step of bulk growing a second SiC single crystal on a face of the solution-grown first SiC single crystal by a sublimation process or a gas process.

12. The method of claim 11, further comprising the steps of:

furnishing a SiC single-crystal wafer obtained from the second SiC single crystal bulk-grown by the sublimation process or the gas process for use as a SiC seed crystal, and growing a third SiC single crystal by a solution process on the SiC seed crystal.

13. The method of claim 12, further comprising the step of bulk growing a fourth SiC single crystal on a face of the solution-grown third SiC single crystal by the sublimation process or the gas process.

14. The production method of claim 10, wherein the growth rate of the first SiC single crystal grown by a solution process is 100 µm/hr or more.

* * * * *